(12) United States Patent
Ohbayashi et al.

(10) Patent No.: US 6,781,869 B2
(45) Date of Patent: Aug. 24, 2004

(54) SEMICONDUCTOR MEMORY

(75) Inventors: Shigeki Ohbayashi, Tokyo (JP);
Yoshiyuki Ishigaki, Tokyo (JP);
Takahiro Yokoyama, Tokyo (JP)

(73) Assignee: Renesas Technology Corp., Toyko (JP)

( * ) Notice: Subject to any disclaimer, the term of this patent is extended or adjusted under 35 U.S.C. 154(b) by 56 days.

(21) Appl. No.: 10/327,890

(22) Filed: Dec. 26, 2002

(65) Prior Publication Data

US 2003/0142538 A1 Jul. 31, 2003

(30) Foreign Application Priority Data

Jan. 29, 2002 (JP) .......................... 2002-019930
Oct. 28, 2002 (JP) .......................... 2002-312887

(51) Int. Cl.[7] .............................................. G11C 11/00
(52) U.S. Cl. ............................. 365/154; 365/227
(58) Field of Search ................................. 365/154, 227

(56) References Cited

U.S. PATENT DOCUMENTS

| 5,508,540 | A | * | 4/1996 | Ikeda et al. ................. 257/298 |
| 5,541,427 | A | | 7/1996 | Chappell et al. ............ 257/306 |
| 5,744,844 | A | | 4/1998 | Higuchi ....................... 257/369 |
| 5,930,163 | A | | 7/1999 | Hara et al. ................... 365/154 |
| 6,657,887 | B2 | * | 12/2003 | Higeta et al. ................ 365/156 |
| 2002/0093111 | A1 | | 7/2002 | Ohbayashi | |

FOREIGN PATENT DOCUMENTS

| JP | 57-12486 | 1/1982 |
| JP | 08-236645 | 9/1996 |
| JP | 11-224935 | 8/1999 |
| JP | P2000-195891 A | 7/2000 |
| JP | P2000-233942 A | 8/2000 |
| JP | P2001-77327 A | 3/2001 |

OTHER PUBLICATIONS

IEEE Journal of Solid State Circuits, vol. 4, No. 11, Nov. 1999.

* cited by examiner

Primary Examiner—M. Tran
(74) Attorney, Agent, or Firm—McDermott Will & Emery LLP

(57) ABSTRACT

A semiconductor memory having: a full CMOS-type of memory cell (10) including an n-type bulk access transistor (7, 8), an n-type bulk driver transistor (5, 6) and a p-type bulk load transistor (3, 4) by twos, and a charge capacitance adding charge capacitor element (9) connected to cell nodes (N1, N2) in order to secure a soft error resistance. In the semiconductor memory, an insulating film (14) and a conductive film (15) are directly formed on each upper side of first and second cell nodes (N1, N2) for constituting a charge capacitor element (9) for adding a charge capacitance. The insulating film (14) is held between the cell node (N1, N2) and the conductive film (15), covering both first and second cell nodes (N1, N2) in common.

10 Claims, 22 Drawing Sheets

EQUIVALENT

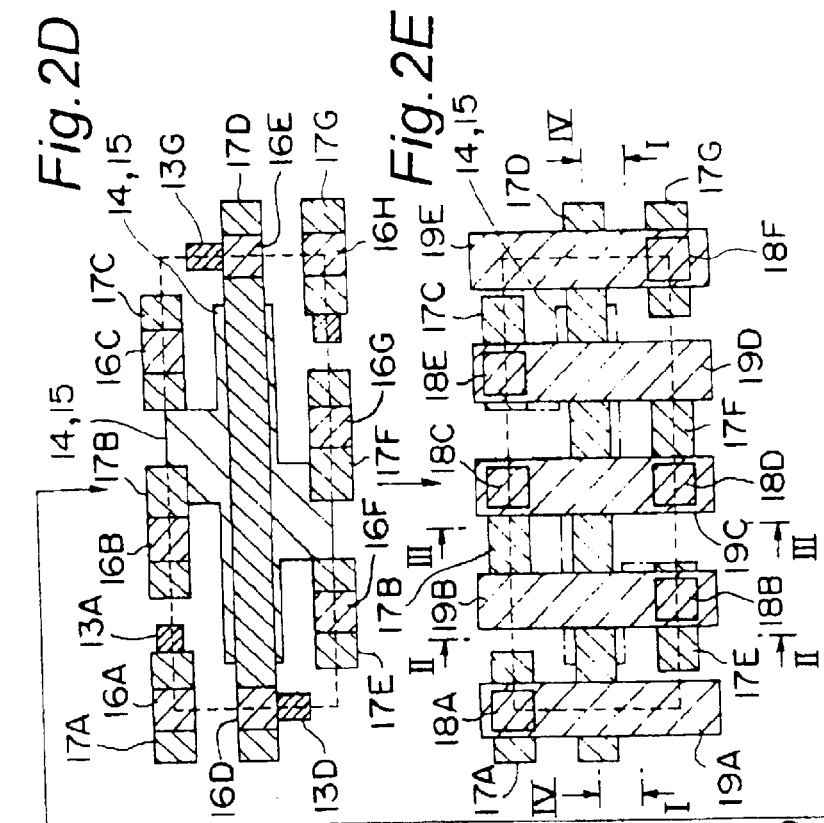
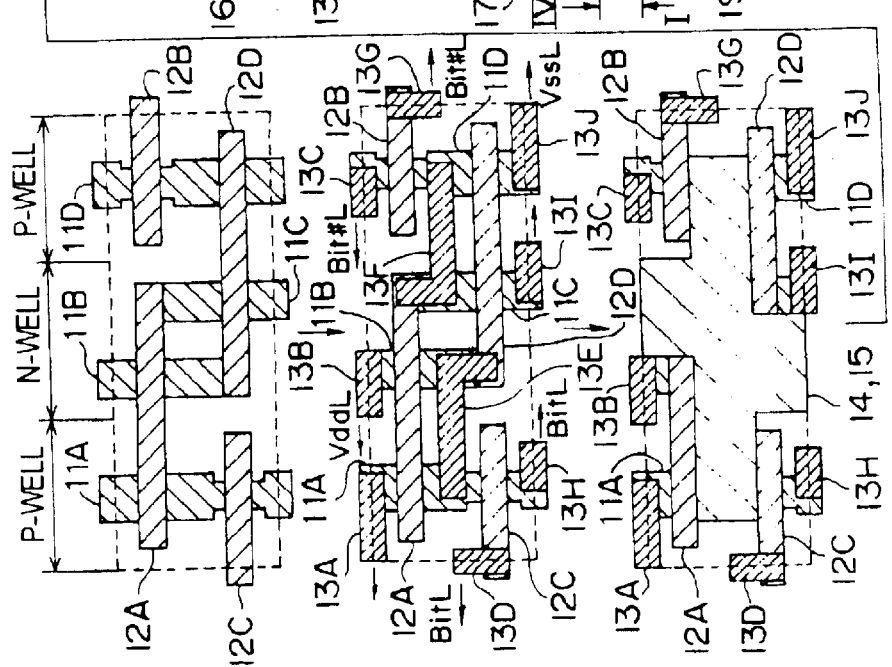

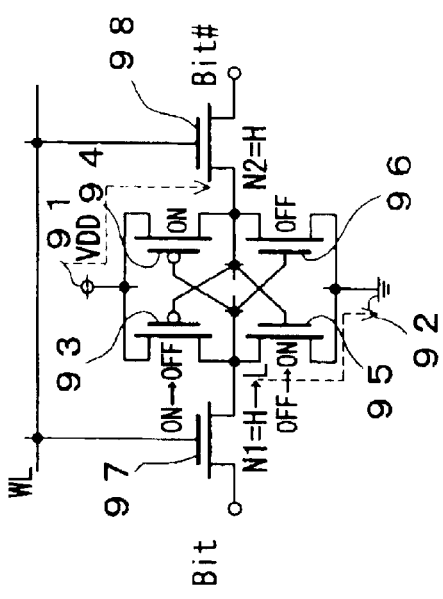
Fig.24A
Fig.24C
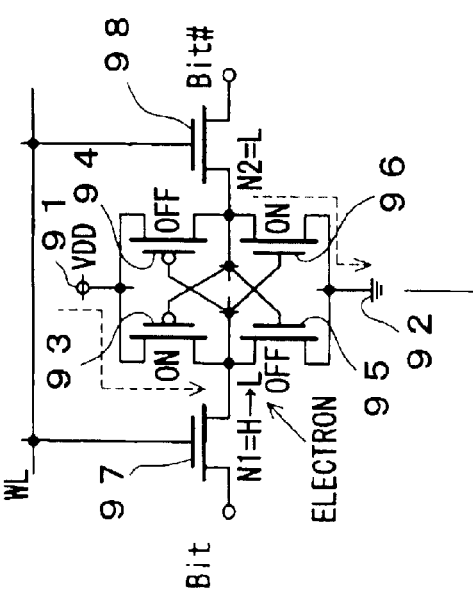
Fig.24B
Fig.24D

SEMICONDUCTOR MEMORY

BACKGROUND OF THE INVENTION

1. Field of the Invention

The present invention relates to a semiconductor memory.

2. Description of the Related Art

The technology for achieving high integration and low voltage of IC is developed, and with the development, an amount of charges held in the storage of a semiconductor memory decreases. As a result, in the semiconductor memory, there is a tendency for the following phenomenon, that is, a so-called soft error to easily generate. Namely, the negative and positive of charges held in the storage change by the influence of radioactive rays such as a ray and leak current. For this reason, in recent years, it has been deeply desired to provide a semiconductor memory, which is excellent for soft error resistance while achieving high integration and low voltage power.

In relation to the above matter, in a static RAM (hereinafter, referred to as SRAM) such that a written data is saved so long as a voltage source is supplied, it is general that an H-side memory node is connected to a voltage source at very low impedance, as compared with SRAM having a high resistance load type or TFT-type of memory cells. Thus, it has been known that SRAM having a bulk six-transistor (full CMOS) type of memory cells is excellent for soft error resistance. In the SRAM having full CMOS-type of memory cells, each memory cell has a structure of including an n-type bulk access transistor, an n-type bulk driver transistor and a p-type bulk load transistor by twos. However, in the SRAM having full CMOS-type of memory cells, a storage charge (voltage x capacitance) of memory cell decreases by low voltage and micro-fabrication of cell size in recent years; as a result, there is a problem such that a soft error is generated.

FIGS. 24A to 24D are views to explain a soft error generation process in a full CMOS-type of memory cell. The memory cell 90 has a general six-transistor cell structure. FIG. 24A shows a general data holding state in the memory cell 90. In this state, cell nodes N1 and N2 are respectively held to H level and L level by a latch operation of inverter constituting by first and second load transistors 93 and 95 and first and second driver transistors 94 and 96. In this case, the cell node N1 at H level is connected to a power input terminal 91 to which a power supply voltage (VDD) is supplied, through the first load transistor 93 in ON-state; on the other hand, the cell node N2 at L level is connected to a ground terminal 92 through the second driver transistor 96 in ON-state.

Then, as shown in FIG. 24B, a large charge instantaneously intrudes into the cell node N1 at H level on the memory cell 90 in such data holding state. In this case, the cell node N1 can not follow the drive to voltage level supplied from the power supply voltage (VDD) by the first load transistor 93. As a result, the cell node N1 is shifted to the L level.

Further, as shown in FIG. 24C, when the cell node N1 is shifted to the L level, the cell node N2 is driven to the voltage level supplied from the power supply voltage (VDD) by the second load transistor 94. As a result, the second driver transistor 96 is changed over from ON-state to OFF-state.

Sequentially, the cell node N2 is driven to the voltage level supplied from the power supply voltage (VDD), and thereby, as shown in FIG. 24D, the first driver transistor 95 is changed over from OFF-state to ON-state so that the cell node N1 is driven to the ground level. In the above manner, the ground terminal 92 and the cell node N1 are connected each other. As a result, the memory cell 90 keeps holding error data.

In order to prevent the generation of soft error as described above, in the SRAM having full CMOS-type of memory cells, predetermined measures must be carried out in design rule of 0.18 or less $\mu$m rule particularly in order to secure a predetermined or more soft error resistance. In the conventional case, the following matter has been known as one of measures for securing the soft error resistance carried out in the semiconductor memory. That is, a charge capacitance is added to the cell node.

For example, Japanese Patent laid-open publication 2001-77327 discloses the technology that, in the semiconductor memory having a plurality of memory cells, the capacitors of adjacent memory cells are formed in mutually different layer, and the adjacent forming regions of the capacitors overlaps with each other on plane, and thereby, a capacitor capacitance is secured much.

Moreover, Japanese Patent laid-open publication 8-236645 discloses the technology that, in the static type of memory cell, a GND line connected to a source region of drive MOSFET is arranged so as to cover a data-transfer MOSFET and the drive MOSFET, and source, channel and drain regions of load thin film transistor are formed on the upper layer of the GND line through an insulating film. Further, a power supply voltage line connected to the source region of the load thin film transistor is arranged in parallel to a word line, and the direction of the channel region of the load thin film transistor is formed in parallel to a bit line. Further, the drain region of the load thin film transistor is formed in a state of being bent into the word line direction and the bit line direction, and a static capacitance section is provided using the GND line and the bent drain region as facing electrodes.

However, the above-mentioned conventional technology has the following problem. More specifically, a charge capacitance is added to the cell node, and thereby, a cell area and the number of manufacturing processes increase, and further, the yield is reduced by the increase of the number of manufacturing processes. In particular, the SRAM having CMOS-type of memory cells has the structure in which six MOS transistors in total are laid out on the same plane, for this reason, the cell area becomes large as compared with SRAM having a high resistance load type of memory cells. Therefore, a reduction of the cell area is further desired.

SUMMARY OF THE INVENTION

It is an object of the present invention to provide a semiconductor memory which can add a charge capacitance to a cell node without increasing a cell area, and is excellent for soft error resistance.

Further, it is another object of the present invention to provide a method for manufacturing a semiconductor memory which can reduce the number of manufacturing processes required for adding a charge capacitance to the cell node, and can prevent a reduction of yield by adding the charge capacitance.

A semiconductor memory of an aspect of the present invention includes a plurality of full CMOS-type of memory cells arranged in an array. Each of said memory cells includes six transistors(that is, first and second load transistors, first and second driver transistors and first and second access transistors), two cell nodes and insulating film and a conductive film. The first load transistor and the first driver transistor are connected in series between a power supply voltage line and a ground voltage line, and have a gate connected to a same line in common. The second load transistor and a second driver transistor are connected in series between the power supply voltage line and the ground voltage line, and have a gate connected to a same line in common. The first cell node connects an active region of said first load transistor to an active region of said first driver transistor and connects with each gate of said second load transistor and said second driver transistor. The second cell node connects an active region of said second load transistor to an active region of said second driver transistor and connects with each gate of said first load transistor and said first driver transistor. The first access transistor is connected between said first cell node and a first bit line, and has a gate connected to a word line. The second access transistor is connected between said second cell node and a second bit line in conjugate with said first bit line, and has a gate connected to a word line. The insulating film and a conductive film directly are formed on said first and second cell nodes for constituting a charge capacitor element with said first and second cell nodes. The insulating film is held between the first and second cell nodes and the conductive film, covering both said first and second cell nodes in common.

Accordingly, a charge capacitance for preventing a generation of soft error is added to the cell node without increasing a cell area, and therefore, it is possible to realize a semiconductor memory which is excellent for soft error resistance.

BRIEF DESCRIPTION OF THE DRAWINGS

FIGS. 2A to 2E are views illustrating each state of a manufacturing process of a memory cell according to a first embodiment of the present invention;

FIGS. 24A to 24D are views explaining a soft error generation processes in a conventional CMOS-type of memory cell.

DETAILED DESCRIPTION OF THE PREFERRED EMBODIMENTS

The preferred embodiments of the present invention will be described below with reference to the accompanying drawings. In this case, a horizontally long type of memory cell known as a cell having high symmetry property will be descried as a typical example of memory cell.

First Embodiment

Figure 1A:
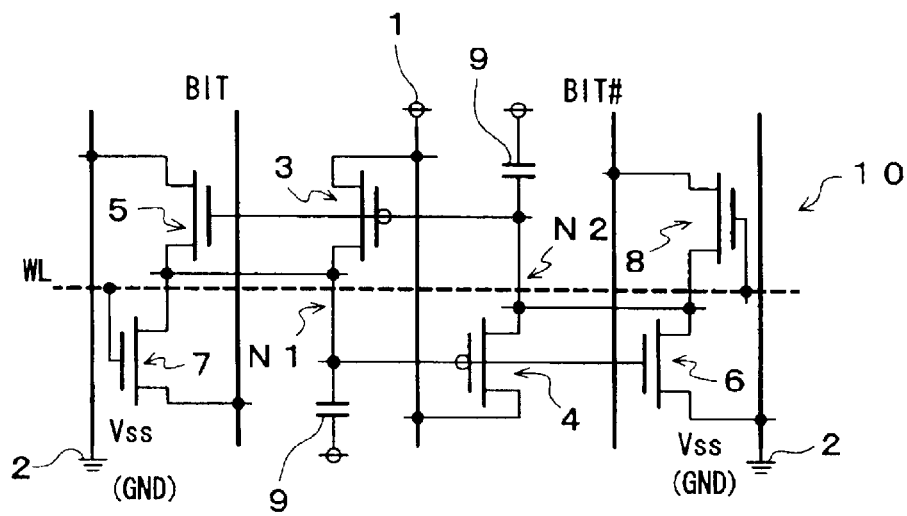
FIGS. 1A and 1B are both circuit diagrams illustrating a CMOS-type of memory cell to which an additional charge capacitance is provided.
Figure 1B:
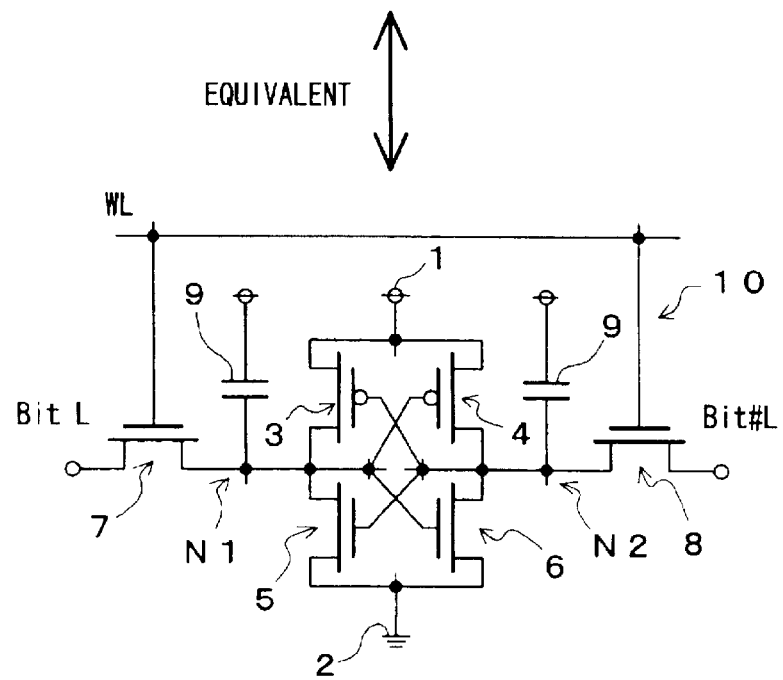

FIG. 1A and FIG. 1B are both circuit diagrams illustrating an exemplary full CMOS-type of memory cell to which an additional charge capacitance is provided in order to prevent a soft error. Further, both circuits shown in FIG. 1A and FIG.

1B are equivalent with each other, and in FIG. 1A, constituent elements are arranged so as to correspond to a structure of the horizontally long type of memory cell; on the other hand, in FIG. 1B, these constituent elements are arranged so that the circuit diagram can be simplified and clarified.

A memory cell 10 has a typical six-transistor cell structure, and includes, as transistor, a first p-type bulk load transistor (hereinafter referred to as "first load transistor") 3, a second p-type bulk load transistor (hereinafter referred to as "second load transistor") 4, a first n-type bulk driver transistor (hereinafter referred to as "first driver transistor") 5, a second n-type bulk driver transistor (hereinafter referred to as "second driver transistor") 6, a first n-type bulk access transistor (hereinafter referred to as "first access transistor") 7, and a second n-type bulk access transistor (hereinafter referred to as "second access transistor") 8.

The first load transistor 3 and the first driver transistor 5 are connected in series between an power input terminal 1 to which a power voltage VDD is supplied and a ground terminal 2. A drain of first load transistor 3 and a source of first driver transistor are connected with each other, and a source of first load transistor 3 is connected to power input terminal 1 while a drain of first driver transistor 5 is connected to ground terminal 2. Furthermore, gates of both transistors 3, 5 are connected to a same line in common.

Likewise, the second load transistor 4 and the second driver transistor 6 are connected in series between the power input terminal 1 and the ground terminal 2. A drain of second load transistor 4 and a source of second driver transistor 6 are connected with each other, and a source of second load transistor 4 is connected to power input terminal 1 while a drain of second driver transistor 6 is connected to ground terminal 2. Furthermore, gates of both transistors 4, 6 are connected to a same line in common.

A drain of first access transistor 7 is connected to the line to which the drain of first load transistor 3 and the source of first driver transistor 5 are connected. A source and a gate of first access transistor 7 are connected to a first bit line (Bit L) and a word line (WL), respectively.

A drain of second access transistor 8 is connected to the line to which the drain of second load transistor 4 and the source of second driver transistor 6 are connected. A source and a gate of second access transistor 8 are connected to a second bit line (Bit#L) and a word line (WL), respectively. The second bit line (Bit#L) is in conjugate with first bit line (Bit L).

Furthermore, memory cell 10 has cell node N1 and N2. The cell node N1 connects with drain of first load transistor 3 and source of first driver transistor 5, connects with drain of first access transistor 7, and connects with gates of second load transistor 4 and second driver transistor 6. The cell node N2 connects with drain of second load transistor 4 and source of second driver transistor 6, connects with drain of second access transistor 8, and connects with gates of second load transistor 3 and second driver transistor 5.

Still furthermore, memory cell 10 has charge capacitor 9 constituted including cell nodes N1 and N2 in order to secure predetermined or more soft error resistance. As described below, charge capacitor 9 is constituted by forming a insulating film and a conductive film on cell nodes N1, N2, and is hereinafter referred as to "charge capacitor element".

FIG. 2A to FIG. 2E are individually a planar layout showing each state of manufacturing processes of a memory cell according to a first embodiment of the present invention. First, FIG. 2A shows a first state of the manufacturing process of memory cell, and well formation, field formation and gate formation are carried out with respect to a semiconductor substrate, and thereby, six transistors shown in FIG. 1 are formed. More specifically, first to fourth active layers 11A to 11D are formed in parallel along a column direction (vertical direction in FIGS. 2A to 2E). The first active layer 11A is arranged on one (left-hand side in FIG. 1A) of P wells regions (first conductive-type well region) formed at both sides on the semiconductor substrate plane. Further, the second and third active layers 11B and 11C are arranged on an N well region (second conductive-type well region) formed at the center on the semiconductor substrate plane. Further, the fourth active layer 11D is arranged on the other (right-hand side in FIG. 1A) of P wells formed at both sides on the semiconductor substrate plane.

Further, as shown in FIG. 2A, first to fourth gate lines 12A to 12D are formed on the upper side of the above active layers 11A to 11D in parallel along a row direction (horizontal direction in FIGS. 2A to 2E). The first gate line 12A is arranged so as to cross the first to third active layers 11A to 11C, and the second gate line 12B is arranged so as to cross the fourth active layer 11D. Further, the third gate line 12C is arranged so as to cross the first active layer 11A, and the fourth gate line 12D is arranged so as to cross the second to fourth active layers 11B to 11D.

As is seen from referring to FIG. 1A in which the arrangement of constituent elements is corresponding to the actual structure, in the active layers 11A to 11D, each transistor is formed. Namely, in the first active layer 11A, the first driver transistor 5 and the first access transistor 7 are formed, and in the second active layer 11B, the first load transistor 3 is formed. Further, in the third active layer 11C, the second load transistor 4 is formed, and in the fourth active layer 11D, the second driver transistor 6 and the first access transistor 8 are formed.

According to the above configuration, the first driver transistor 5 and the first load transistor 3 formed individually in the active layers 11A and 11B have the same potential by the first gate line 12A. Further, the second load transistor 4 and the second driver transistor 6 formed individually in the active layers 11C and 11D have the same potential by the fourth gate line 12D. Moreover, the second and third gate lines 12B and 12C constitute the first and second access transistors 7 and 8 together with the first and fourth active layers 11A and 11D, respectively. Further, the second and third gate lines 12B and 12C have a gate (not shown) common to the first and second access transistors 7 and 8.

FIG. 2B shows a second state in the manufacturing process of memory cell. In this case, a node line comprising a tungsten damascene line, and a damascene line to be connected to the following line, that is, word line (WL)/first bit line (Bit L)/second bit line (Bit #L)/power supply voltage line (VddL)/ground voltage line (VssL) are formed.

More specifically, a damascene line 13A is formed so as to guide one end portion (i.e., source of the first driver transistor 5) of the first active layer 11A to the ground voltage line (VssL) to be a contact line for supplying ground voltage. A damascene line 13B is formed so as to guide one end portion (i.e., source of the first load transistor 3) of the second active layer 11B to the power supply voltage line (VddL) to be a contact line for supplying power voltage. A damascene line 13C is formed so as to guide one end portion (i.e., source of the second access transistor 8) of the fourth active layer 11D to the second bit line (Bit #L). A damascene line 13D is formed so as to guide one end portion (i.e., gate of the first access transistor 7) of the gate line 12C to the first bit line (Bit L). A substantially L-shaped damascene line 13E is formed so as to connect the following terminals. Namely, the terminals are the midway portion (i.e., each drain of the first access transistor 7 and the first driver transistor 5) of the first active layer 11A, one end portion (i.e., drain of the first load transistor 3) of the second active layer 11B, and one end portion of the gate line 12D (i.e., gate line connecting each gate of the second load transistor 4 and the second driver transistor 6). A substantially L-shaped damascene line 13F is formed so as to connect the following terminals. Namely the terminals are the midway portion (i.e., each drain of the second access transistor 8 and the second driver transistor 6) of the fourth active layer 11D, one end portion (i.e., drain of the second load transistor 4) of the third active layer 11C, and one end portion of the gate line 12A (i.e., gate line connecting each gate of the first load transistor 3 and the first driver transistor 5). A damascene line 13G is formed so as to guide one terminal (i.e., gate of the second access transistor 8) of the gate line 12B to the second bit line (Bit #L). A damascene line 13H is formed so as to guide one end portion (i.e., source of the first access transistor 7) of the first active layer 11A to the first bit line (Bit L). A damascene line 13I is formed so as to guide one end portion (i.e., source of the second load transistor 4) of the third active layer 11C to the power supply voltage line (VddL) to be a contact line for supplying power voltage. A damascene line 13J is formed so as to guide one end portion (i.e., source of the second driver transistor 6) of the fourth active layer 11D to the ground voltage line (VssL) to be a contact line for supplying ground voltage.

The substantially L-shaped damascene lines 13E and 13F correspond to the cell nodes N1 and N2 in the memory cell 10 shown in FIG. 1, respectively. As shown in FIG. 2B, the damascene line 13E is arranged to connect an active region (i.e. second active layer 11B) of first load transistor 3 to an active region of first driver transistor 5 (i.e. first active layer 11A) and cross the P-well region on which first driver transistor 5 is constituted and the N-well region on which first load transistor 3 is constituted. The damascene line 13F is arranged to connect an active region of second load transistor 4 (i.e. third active layer 11C) to an active region of second driver transistor 6 (i.e. fourth active layer 11D) and cross the P-well region on which second driver transistor 6 is constituted and the N-well region on which second load transistor 4 is constituted.

SRAM having a full CMOS-type of memory cell according to the present invention is constructed in a manner that a plurality of memory cells having the above-mentioned interconnection structure are arrayed; in this case, excepting the damascene lines 13E and 13F, other damascene lines 13A to 13D and 13G to 13J are commonly shared between adjacent memory cells.

FIG. 2C shows a third state in the manufacturing process of memory cell. In this case, charge capacitance is added in order to prevent a generation of soft error. More specifically, a plate-shaped insulating film 14 is formed on the memory cell of the state shown in FIG. 2B so as to contact with only L-shaped damascene lines 13E and 13F, which function as cell nodes N1 and N2. Further, the surface of the insulating film 14 is overlaid with a conductive film 15, which have substantially the same shape as the insulating film 15. In this case, a sufficient margin is set between the conductive film 15 and the damascene lines so that the conductive film 15 does not contact with the damascene lines 13A, 13C, 13D, 13G, 13H and 13J.

As described above, in this first embodiment, the insulating film 14 and the conductive film 15 are formed directly on the cell nodes N1 and N2 so that the insulating film 14 is held between the cell nodes N1 and N2 and the conductive film 15, and thereby, a charge capacitor element is formed. Thus, charge capacitance is added in order to prevent a generation of soft error.

FIG. 2D shows a fourth state in the manufacturing process of memory cell, and in this case, a plurality of one-layer metal line are formed along the row direction. In FIG. 2D, the active layer and the gate line are omitted in order to simplify the drawing. More specifically, one-layer metal lines 17A to 17C and 17E to 17G are connected to the damascene lines 13A to 13C and 13H to 13J through stacked via contacts (hereinafter, referred to as SV contact) 16A to 16C and 16F to 16H, respectively. Further, a one-layer metal line 17D constituting the word line (WL) is connected to the damascene lines 13D and 13G through SV contacts 16D and 16E at the vicinity of its both ends, like other one-layer metal lines.

The one-layer metal lines 17A, 17B and 17C are connected to the ground voltage line (VssL), the power supply voltage line (VddL) and the second bit line (Bit #L), respectively. Both terminal sides of the one-layer metal line 17D constituting the word line (WL) are respectively connected to gate lines 12C and 12B constituting each gate of the first and second access transistors 7 and 8 through the damascene lines 13D and 13G. Further, the one-layer metal lines 17E, 17F and 17G are connected to the first bit line (Bit L), the power supply voltage line (VddL) and the ground voltage line (VssL), respectively.

In addition, SRAM having a full CMOS-type of memory cell according to the present invention is constructed in a manner that a plurality of memory cells having the above interconnection structure are arrayed, as described above. In this case, all one-layer metal lines 17A to 17G are commonly shaped between adjacent memory cells.

FIG. 2E shows a fifth state in the manufacturing process of memory cell, and in this case, a plurality of two-layer metal lines are formed along the column direction. More specifically, a two-layer metal line 19A constituting the ground voltage line (VssL) is positioned so as to pass over the one-layer metal line 17A, and is connected to the one-layer metal line 17A through an SV contact 18A. Further, a two-layer metal line 19B constituting the first bit line (Bit L) is positioned so as to pass over the one-layer metal line 17E, and is connected to the one-layer metal line 17E through an SV contact 18B. Further, a two-layer metal line 19C constituting the power supply voltage line (VddL) is positioned so as to pass over the one-layer metal lines 17B and 17F, and is connected to the one-layer metal lines 17B and 17F through SV contacts 18C and 18D. Further, a two-layer metal line 19D constituting the second bit line (Bit #L) is positioned so as to pass over the one-layer metal line 17C, and is connected to the one-layer metal line 17C through an SV contact 18E. Further, a two-layer metal line 19E constituting the ground voltage line (VssL) is positioned so as to pass over the one-layer metal line 17G, and is connected to the one-layer metal line 17G through an SV contact 18F.

In addition, SRAM having a full CMOS-type of memory cell according to the present invention is constructed in a manner that a plurality of memory cells having the above-mentioned interconnection structure are arrayed; in this case, all two-layer metal lines 19A to 19E are commonly shaped between adjacent memory cells in the SRAM.

Next, the manufacturing process of memory cell including a multi-layer structure will be described in detail with reference to FIG. 3 to FIG. 6. FIG. 3, FIG. 4, FIG. 5 and FIG. 6 are respectively views showing the flow until the memory cell reaches each state shown in the longitudinal sectional views taken along the lines I—I, II—II, III—III, and IV—IV of FIG. 2E. In this case, FIG. 4 and FIG. 5 are sectional views along the column direction, and a plurality of adjacent memory cells are shown therein. In the flow, first, field formation is carried out on the semiconductor substrate so that the active layers 11A to 11D can be generated. At that time, an isolation oxide film 20 is formed on portions of the semiconductor substrate except the active layers 11A to 11D (the active layer 11B is not shown in FIG. 3). The state in each cross section until this process is shown in FIG. 3A, FIG. 4A, FIG. 5A and FIG. 6A.

Figure 3A:
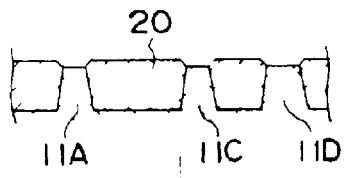
FIGS. 3A to 3H are cross sectional views taken along the line I—I of FIG. 2E, and illustrate each state of the manufacturing process of the above memory cell.
Figure 3B:
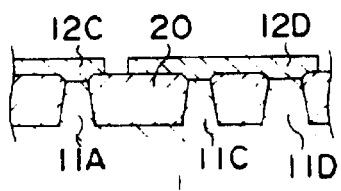
Figure 3C:
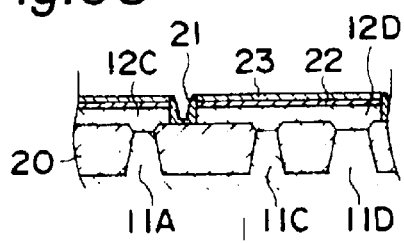
Figure 3D:
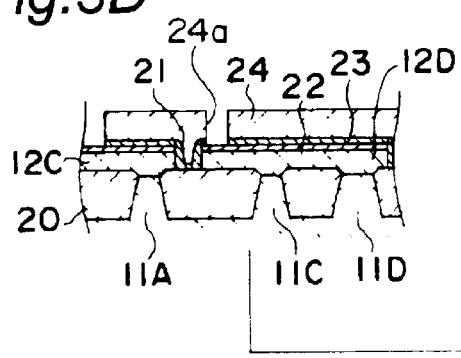
Figure 3E:
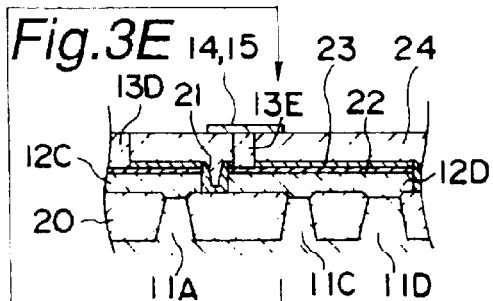
Figure 3F:
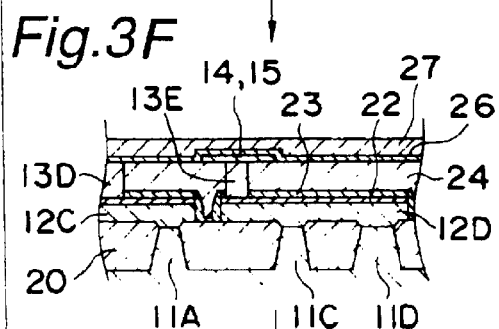
Figure 3G:
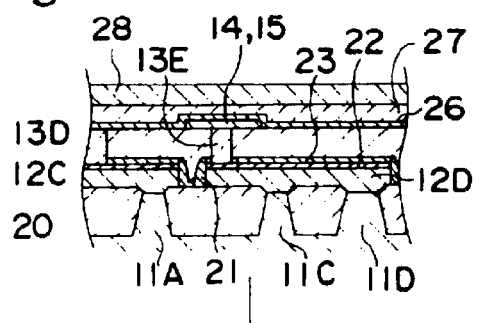
Figure 4A:
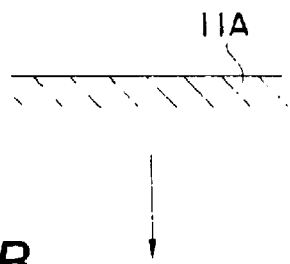
FIGS. 4A to 4G are cross sectional views taken along the line II—II of FIG. 2E, and illustrate each state of the manufacturing process of the above memory cell.
Figure 4B:
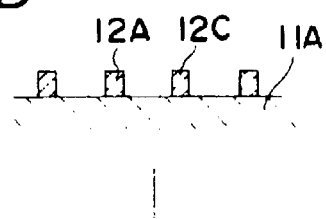
Figure 4C:
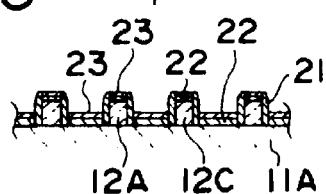
Figure 4D:
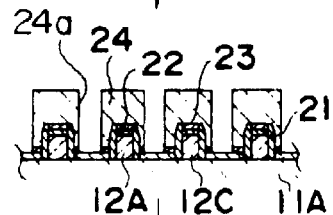
Figure 4E:
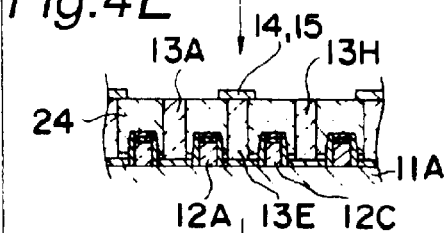
Figure 4F:
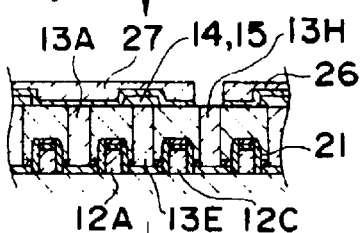
Figure 4G:
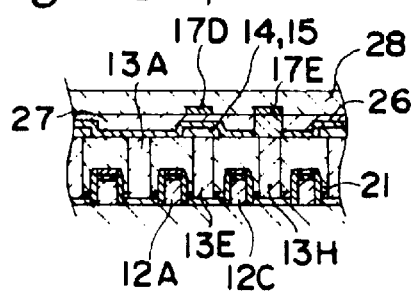
Figure 5A:
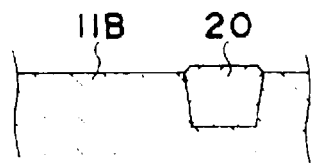
FIGS. 5A to 5G are cross sectional views taken along the line III—III of FIG. 2E, and illustrate each state of the manufacturing process of the above memory cell.
Figure 5B:
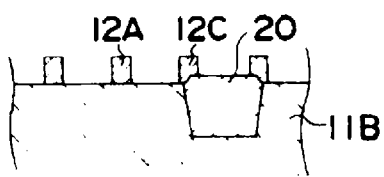
Figure 5C:
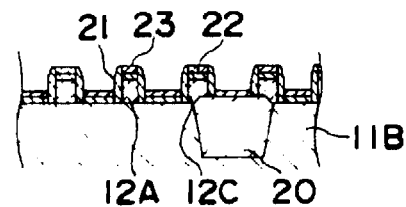
Figure 5D:
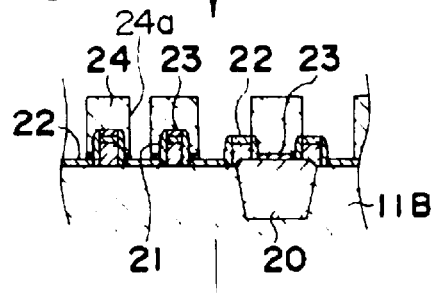
Figure 5E:
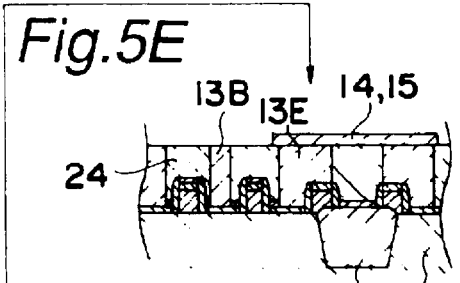
Figure 5F:
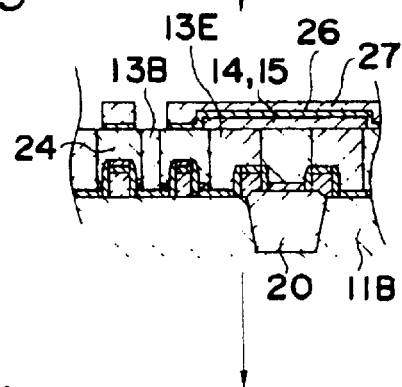
Figure 5G:
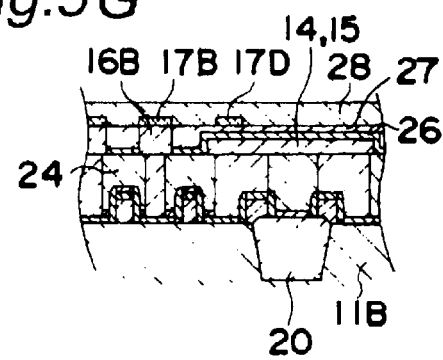

Sequentially, impurity is added by ion implantation so that wells can be formed. Then, after a gate oxide film is deposited, polysilicon is deposited so that the gate lines 12A to 12D can be formed. Thereafter, implantation and patterning are carried out in order to form each transistor. The state in each cross section until this process is shown in FIG. 3B, FIG. 4B and FIG. 5B.

Further, the gate lines 12A to 12D are individually formed with a side wall 21 at their side surface. A material capable of performing the function as a stopper is used as the side wall 21 in oxide etching. Thereafter, impurity is implanted by ion implantation so that source/drain can be formed. Further, a CoSi$_2$ film is deposited. Then, an etching stopper film 23 consisting of SiN is deposited on the CoSi$_2$ film. The state in each cross section until this process is shown in FIG. 3C, FIG. 4C, FIG. 5C and FIG. 6B.

Sequentially, a planarization insulating film 24 is deposited, and thereafter, is etched by tungsten damascene interconnection mask so that an interconnection trench 24a can be formed. The above etching is stopped at an etching stopper 23. After the planarization insulating film 24 is etched, the exposed etching stopper film 22 is removed. The state in each cross section until this process is shown in FIG. 3D, FIG. 4D, FIG. 5D and FIG. 6C.

Thereafter, tungsten is buried in the interconnection trench 24a so that a line (tungsten line) can be formed. Next, the surface is planarized so that tungsten remains in only interconnection trench 24a. Further, the insulating film 14 is deposited, and thereafter, the conductive film 15 is deposited on the surface of the insulating film 14. Sequentially, the insulating film 14 and the conductive film 15 are etched so that a plate-shaped charge capacitor element as shown in FIG. 2C can be obtained. The state in each cross section until this process is shown in FIG. 3E, FIG. 4E, FIG. 5E and FIG. 6D.

Further, an etching stopper layer 26 and a planarization insulating film 27 are deposited. Further, a stacked via contact hole is formed. The hole formation is stopped at the etching stopper film 24. After the planarization insulating film 27 is etched, the exposed etching stopper layer 26 is removed. The state in each cross section until this process is shown in FIG. 3F, FIG. 4F, FIG. 5F and FIG. 6E.

Sequentially, tungsten (W) is buried in the hole as the stacked via contacts 16A to 16H, and then, other tungsten is removed. Further, one-layer metal interconnection metal is deposited on the entire surface, and then, metal other than the one-layer metal interconnection is etched by one-layer metal mask (not shown). The state in each cross section until this process is shown in FIG. 3G, FIG. 4G, FIG. 5G and FIG. 6F. In this first embodiment, tungsten is used as metal buried in the interconnection trench and the stacked via hole; however, in this case, the present invention is not limited to tungsten, and for example, other metal such as copper may be used.

Figure 3H:
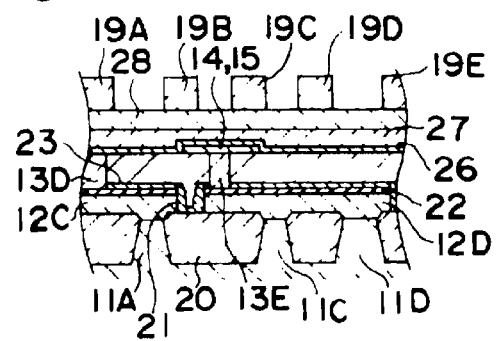
Figure 6A:
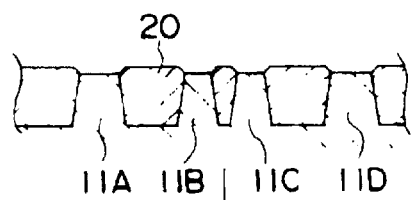
FIGS. 6A to 6G are cross sectional views taken along the line IV—IV of FIG. 2E, and illustrate each state of the manufacturing process of the above memory cell.
Figure 6B:
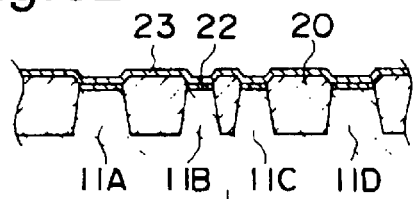
Figure 6C:
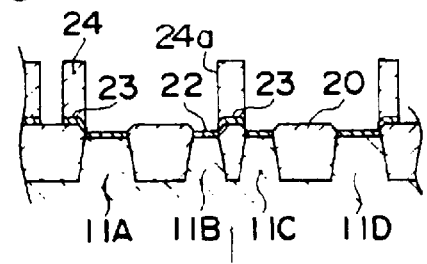
Figure 6D:
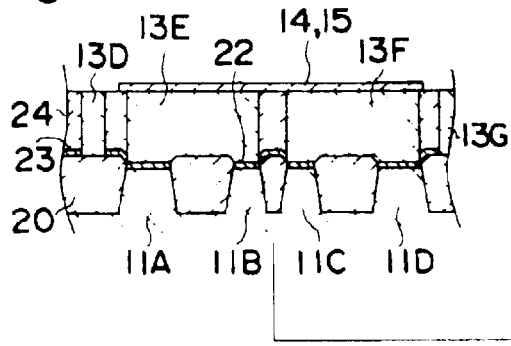
Figure 6E:
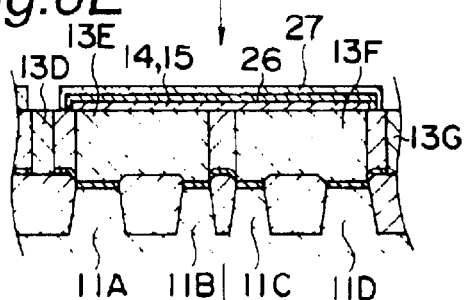
Figure 6F:
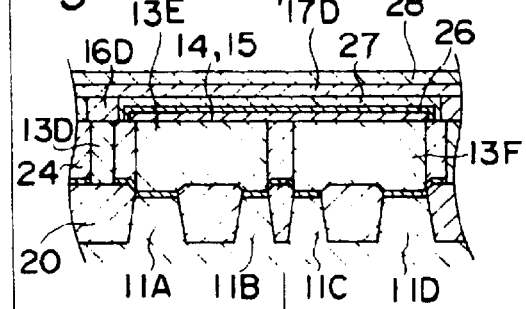
Figure 6G:
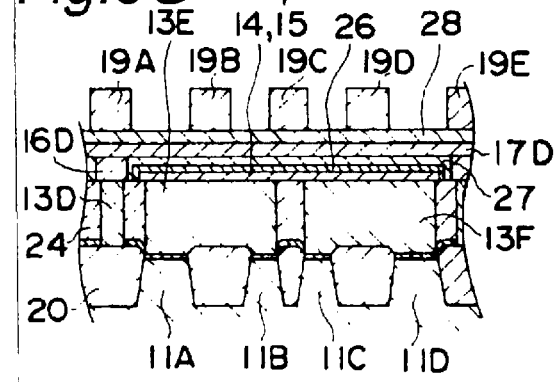

Thereafter, the stacked via contact hole (not shown) is formed. Then, tungsten is buried in the hole, and other tungsten is etched. Thereafter, two-layer metal interconnection metal is deposited, and then, is etched. The state in each cross section until this process is shown in FIG. 3H and FIG. 6G.

Although not shown in particular, interlayer dielectric is further deposited after the above processes, and then, the stacked via contact hole is formed. Thereafter, tungsten is buried in the stacked via contact hole thus formed. Finally, three-layer metal interconnection metal is deposited and etched.

Figure 7A:
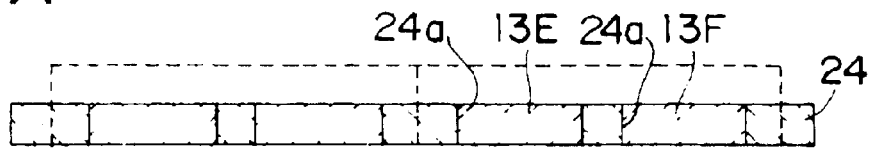
FIGS. 7A to 7F are views illustrating each state of a formation process of a charge capacitor element included in the above memory cell.

With reference to FIG. 7A to FIG. 7F, the formation flow of charge capacitor element will be described in detail; in this case, the charge capacitor element is composed of the cell nodes N1 and N2 and the insulating film 14 and the conductive film 15 formed on these cell nodes. FIG. 7A to FIG. 7F correspond to the cross section shown in FIG. 6, and in this case, there are shown layers situated above from the planarization insulating film 24 and damascene lines 13E and 13F. As shown in FIG. 7A, tungsten is buried in the tungsten damascene interconnection trench 24a formed in the planarization insulating film 24 so that damascene lines 13E and 13F can be formed.

Figure 7B:
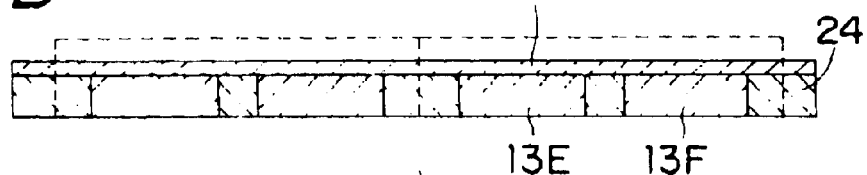
Figure 7C:
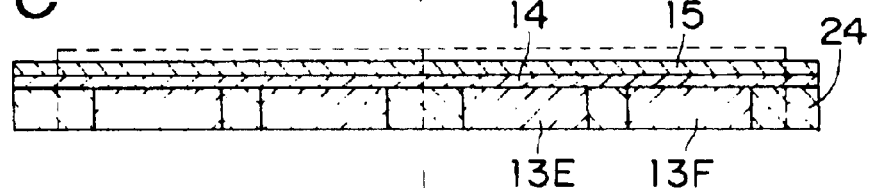

In the case of forming the charge capacitor element, first, as shown in FIG. 7B, the insulating film 14 is formed on the surface of the planarization insulating film 24 and the damascene lines 13E and 13F. Next, as shown in FIG. 7C, the conductive film 15 is formed is formed on the surface of the insulating film 14.

Figure 7D:
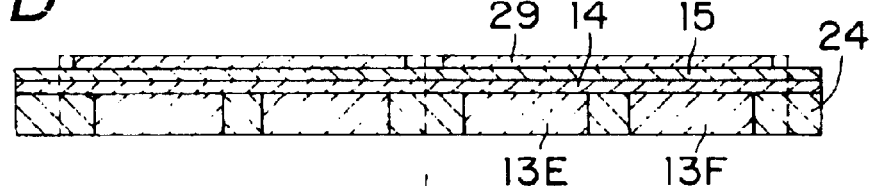
Figure 7E:
Figure 7F:
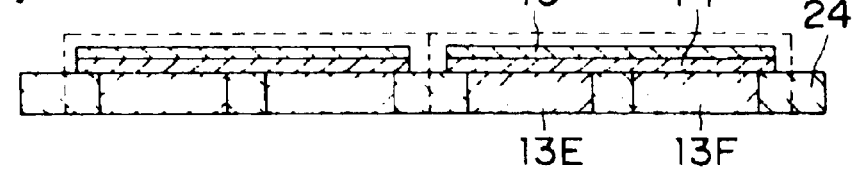

Sequentially, as shown in FIG. 7D, a resist having the plate shape of the charge capacitor element shown in FIG. 2C is formed on the surface of the conductive film 15. Then, as shown in FIG. 7E, the insulating film 14 and the conductive film 15 are etched. Thereafter, as shown in FIG. 7F, the resist is removed, and thereby, it is possible to form the insulating film 14 and the conductive film 15 having the plate shape of the charge capacitor element shown in FIG. 2C.

As described above, in this first embodiment, the charge capacitor element is composed of the cell nodes N1 and N2 and the insulating film 14 and the conductive film 15 formed on these cell nodes. Further, the charge capacitor element is directly formed on the damascene lines 13E and 13F used as the node cells N1 and N2 shown in FIG. 1, and included is the memory cell. Thus, it is possible to increase a charge capacitance for preventing the generation of soft error without increasing a cell area, and thus, to realize a memory cell having a high soft error resistance. In this case, only one mask is required in order to add the charge capacitance, so that the reduction of yield and the increase of manufacturing cost can be prevented.

Further, in the first embodiment, as described above, cell node N1 is arranged to cross and cell node N2 is arranged so as to cross the P-well region on which first driver transistor 5 is constituted and the N-well region on which first load transistor 3 is constituted, and cell node N2 is arranged so as to cross the P-well region on which second driver transistor 6 is constituted and the N-well region on which second load transistor 4 is constituted. Accordingly, cell nodes N1 and N2 can be set long comparatively, and therefore, a large charge capacitance can be obtained.

As described above, cell nodes N1, N2 are elements formed by burying a conductive material in a trench 24a formed in an interlayer insulating film 24 deposited on each of transistors. Accordingly, each cell node can be formed to be thick continuously, and therefore, a charge supply from charge capacitor element can be stabilized.

Still further, in the operation, on condition that power voltage Vdd on the source side of the first and second load transistors 3 and 4 is supplied to the conductive film 15, a margin between conductive film 15 and damascene lines 13B and 13I connected to power voltage line VddL can be set to zero or less than a margin between an insulating film 15 and a damascene line connecting with each ground voltage line or each bit line. Accordingly, a conductive film 15 can be set larger, and therefore, a large charge capacitance can be obtained.

Furthermore, in this first embodiment, the cell having a high symmetry property, that is, the horizontally long type of memory cell is applied, and thereby, various constituent elements including transistors and charge capacitor element are arranged symmetrically. Therefore, it is possible to prevent a reduction of yield resulting from the work requiring orientation such as transfer.

The following is a description on other embodiments. In this case, the same reference numerals are used to designate the elements identical to the above first embodiment, and the details are omitted.

Second Embodiment

Figure 8A:
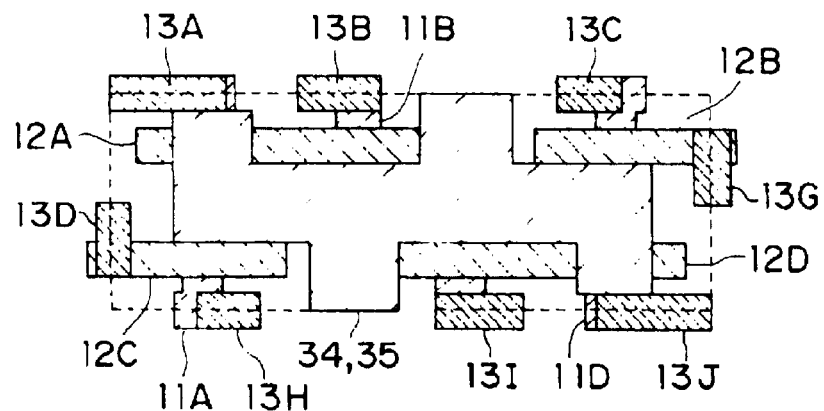
FIG. 8A is a planar layout illustrating a state of the manufacturing process of a full CMOS-type of memory cell corresponding to state shown in FIG. 2C according to a second embodiment of the present invention.
Figure 8B:
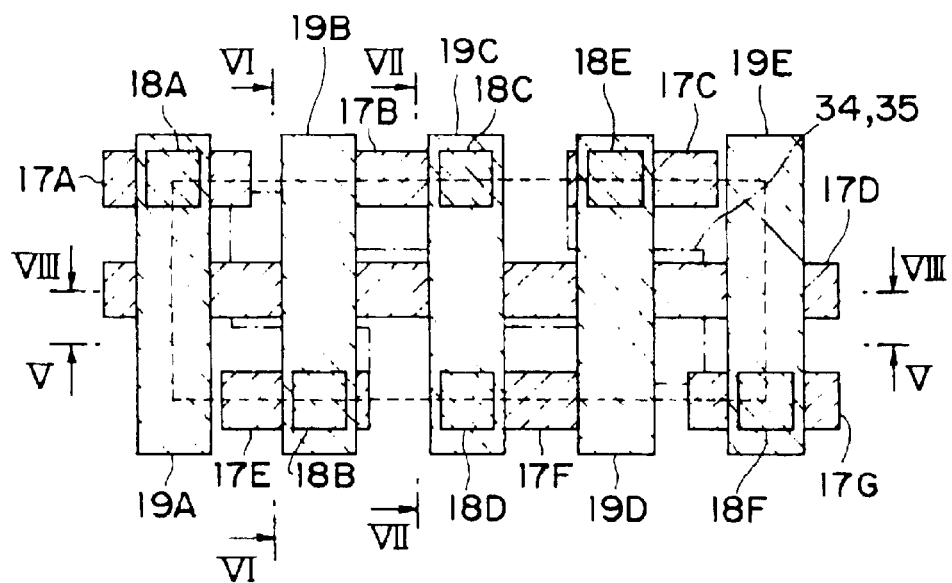
FIG. 8B is a planar layout illustrating a state of the manufacturing process of a full CMOS-type of memory cell corresponding to state shown in FIG. 2E according to the second embodiment of the present invention.
Figure 9:
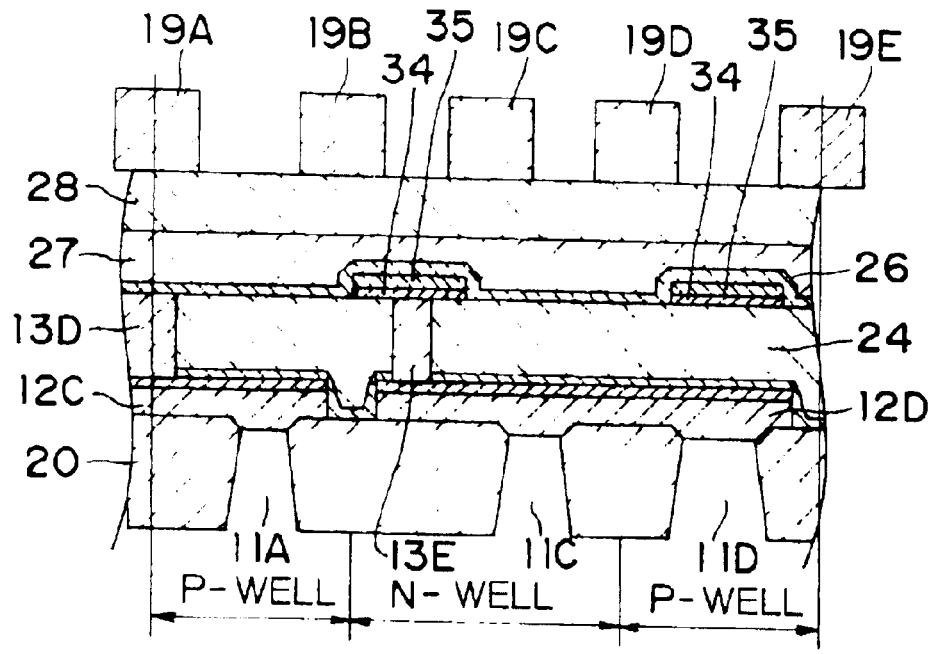
FIG. 9 is a longitudinal sectional view taken along the line V—V of FIG. 8B.
Figure 10:
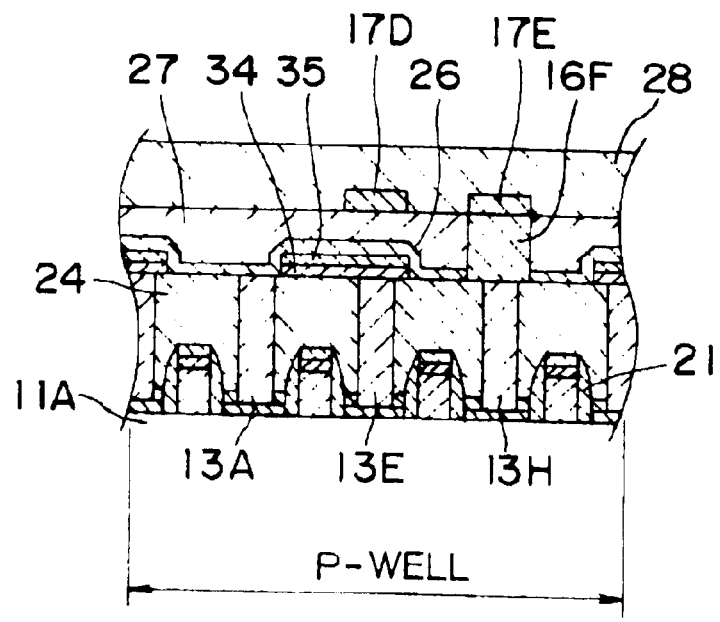
FIG. 10 is a longitudinal sectional view taken along the line VI—VI of FIG. 8B.

FIG. 8 shows a planar layout in each state of a manufacturing process of a CMOS-type of memory cell according to a second embodiment of the present invention, and FIG. 8A and FIG. 8B correspond to FIG. 2C and FIG. 2E, respectively. In the above first embodiment, the potential of the conductive film 15 constituting the charge capacitor element has been set to the power supply voltage (Vdd). Without being limited to the above voltage, the potential of the conductive film constituting the charge capacitor element may be set to the ground voltage (Vss) so as to become the same potential as the source of the first and second driver transistors 5 and 6. In this case, as shown in FIG. 8A, a sufficient margin is set between the charge capacitor element and the damascene lines so that no contact of the charge capacitor element and the damascene lines 13B to 13I is made. On the other hand, a margin between the charge capacitor element and the damascene lines 13A and 13J connected to the ground voltage line (VssL) can be set to zero or less than a margin between an insulating film 35 and a damascene line connected to each power voltage line or each bit line. Accordingly, a conductive film can be set larger, and therefore, a large charge capacitance can be obtained. FIG. 8B is a planar layout of the substantially final state of the manufacturing process of a CMOS-type of memory cell.

Figure 11:
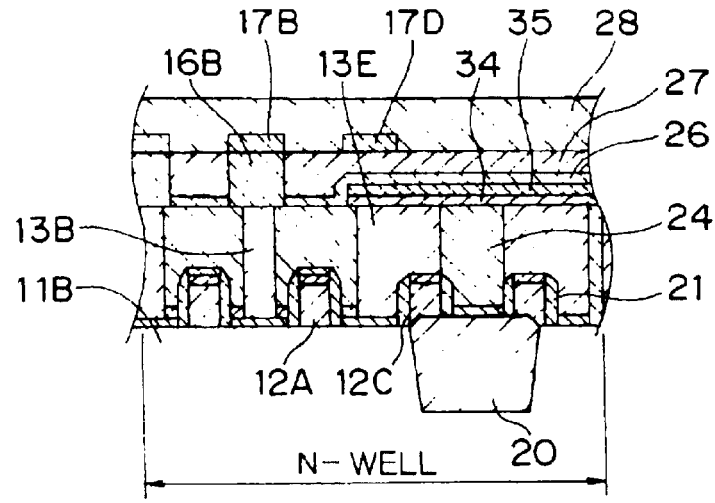
FIG. 11 is a longitudinal sectional view taken along the line VII—VII of FIG. 8B.
Figure 12:
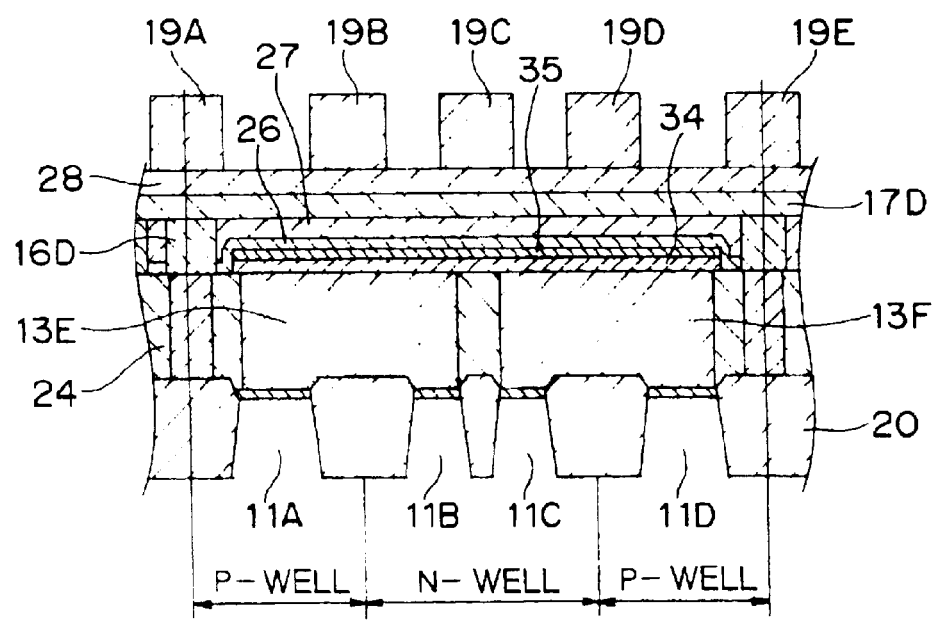
FIG. 12 is a longitudinal sectional view taken along the line VIII—VIII of FIG. 8B.

FIG. 9 to FIG. 12 are individually longitudinal sectional views taken along the lines V—V, Vi—VI, VII—VII, and VIII—VIII of FIG. 8B. In this case, FIG. 9 to FIG. 12 correspond to FIG. 3H, FIG. 4G, FIG. 5G and FIG. 6G, respectively, and FIG. 11 and FIG. 12 are the same as FIG. 5G and FIG. 6G; therefore, the details are omitted.

In the second embodiment, in order to bury the margin between the charge capacitor element and the damascene line 13J connected to the ground voltage line (VssL), an insulating film 34 and a conductive film 35 constituting the charge capacitor element together with the cell node are formed so as to extend to the damascene line 13J. This portion corresponds to the insulating film 34 and the conductive film 35 shown on the right-hand side in FIG. 9.

Further, according to this second embodiment, in order to bury the margin between the charge capacitor element and the damascene line 13A connected to the ground voltage line (VssL), an insulating film 34 and a conductive film 35 constituting the charge capacitor element together with the cell node are formed so as to extend to the damascene line 13A. This portion corresponds to the insulating film 34 and the conductive film 35 shown on the left-hand side from the center in FIG. 9.

As described above, in the case where the potential of the conductive film 35 is set to the same potential as the source of the first and second driver transistors 5 and 6, no margin is required between the charge capacitor element and each of the damascene lines 13A and 13J connected to the ground voltage line (VssL) Therefore, the charge capacitor element can be formed larger, and a larger charge capacitance can be added.

In addition, there is the case where the following matter is required depending upon memory cell array; more specifically, the charge capacitor element or the conductive film is connected in the row direction while being isolated in the column direction. When the charge capacitor element or conductive film is formed into the shape as shown in FIG. 8A and the potential of the conductive film is set to the ground voltage, in the adjacent memory cells in the column direction, the charge capacitor element or the conductive film is connected in the column direction through the damascene lines 13A and 13J. For this reason, in the above case, a sufficient margin must be set between the charge capacitor element or the conductive film and the damascene lines 13A and 13J, in addition to between the charge capacitor element or the conductive film and the damascene lines 13B and 13I.

Third Embodiment

Figure 13A:
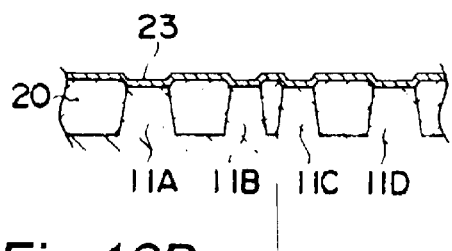
FIGS. 13A to 13F are views illustrating each state of a formation process of a cell node and a charge capacitor element included in a memory cell according to a third embodiment of the present invention.
Figure 13B:
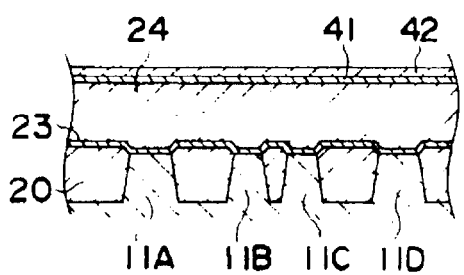

FIG. 13A to FIG. 13F are views showing each state of a formation process of a cell node and a charge capacitor element included in a memory cell according to a third embodiment of the present invention. The third embodiment differs from the above first embodiment in that the following technology (so-called dual damascene process) is employed. According to the dual damascene process, the interconnection trench and a recess communicating with the interconnection trench are formed, and thereafter, these trench and recess are simultaneously buried so that a cell node and a charge capacitor element are formed. In the state shown in FIG. 13A, the active layers 11A to 11D are formed like the case of the above first embodiment, and thereafter, the etching stopper film 23 is formed. From this state, the planarization insulating film 24 is formed on the entire surface as shown in FIG. 13B, and further, an etching stopper layer 41 and a planarization insulating film 42 are deposited thereon.

Figure 13C:
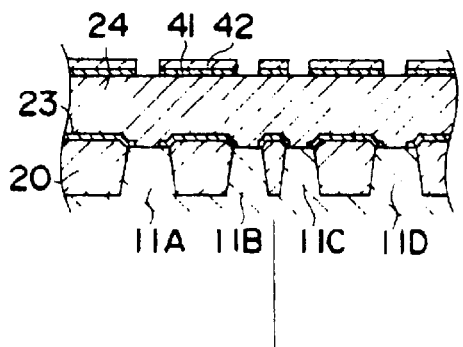
Figure 13D:
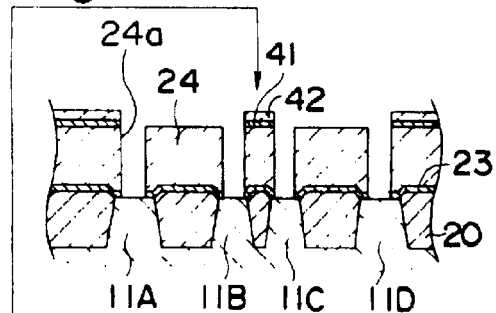
Figure 13E:
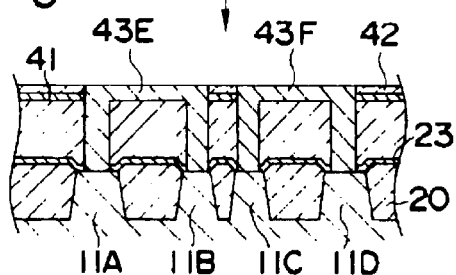
Figure 13F:
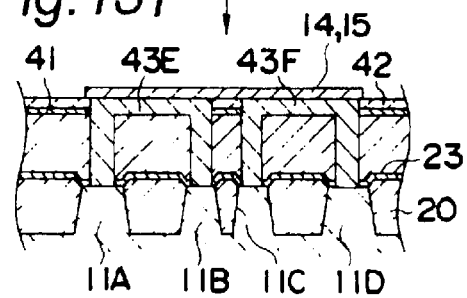

Thereafter, the upper-layer side planarization insulating film 42 is etched using contact mask (not shown) at portions corresponding to the active layers 11A to 11D. The above etching is stopped at the etching stopper film 41. Then, the externally exposed etching stopper film 41 is removed. The state until this process is shown in FIG. 13C. Further, the lower-layer side planarization insulating film 24 and the upper-layer side planarization insulating film 42 are etched using node mask (not shown). The above etching is stopped at the etching stopper films 23 and 41. Then, the externally exposed etching stopper films 23 and 41 are removed. The state until this process is shown in FIG. 13D. Thus, the recess is formed so as to communicate with the interconnection trench 24a formed in the planarization insulating film 24 and the interconnection trench 24a formed in the planarization insulating film 42.

Sequentially, tungsten is simultaneously buried in the interconnection trench 24a and the recess, and then, the surface is planarized so that tungsten remains in only interconnection trench 24a and recess. Thus, the line in the interconnection trench 24a and the cell nodes N1 and N2 (see FIG. 1) are integrally formed by tungsten 43E and 43F.

Sequentially, the insulating film 14 and the conductive film 15 are deposited on the entire surface. Then, the insulating film 14 and the conductive film 15 are etched using capacitor formation mask (not shown) so as to contact with the cell nodes N1 and N2 formed of tungsten 43E and 43F.

As described above, according to this third embodiment, the line in the interconnection trench and the cell node are integrally formed; therefore, the number of formation processes can be reduced as compared with the case of forming these line and cell node independently.

Fourth Embodiment

Figure 14A:
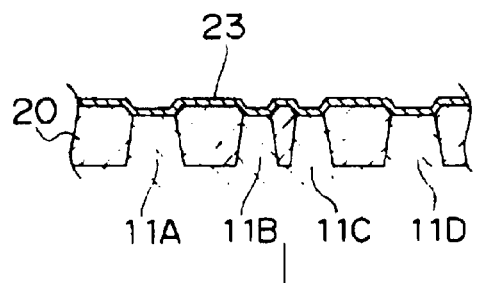
FIGS. 14A to 14E are views illustrating each state of a formation process of a cell node and a charge capacitor element included in a memory cell according to a fourth embodiment of the present invention.
Figure 14B:
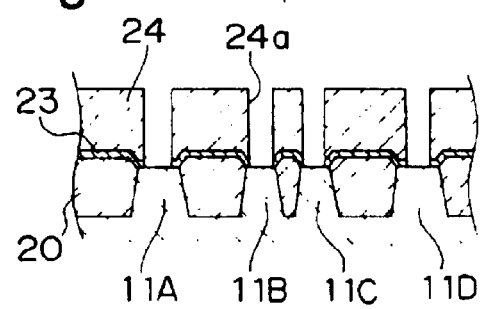

FIG. 14A to FIG. 14E are views illustrating each state of a formation process of a cell node and a charge capacitor element included in a memory cell according to a fourth embodiment of the present invention. In this fourth embodiment, other metal in place of tungsten is used as a material for constituting the cell nodes N1 and N2. In the state shown in FIG. 14A, the active layers 11A to 11D are formed, and thereafter, the etching stopper film 23 is formed. In this state, the planarization insulating film 24 is formed on the entire surface, and further, the formed planarization insulating film 24 is etched at portions corresponding to the active layers 11A to 11D. Thereafter, the externally exposed etching stopper film 23 is removed. The state until this process is shown in FIG. 14B.

Figure 14C:
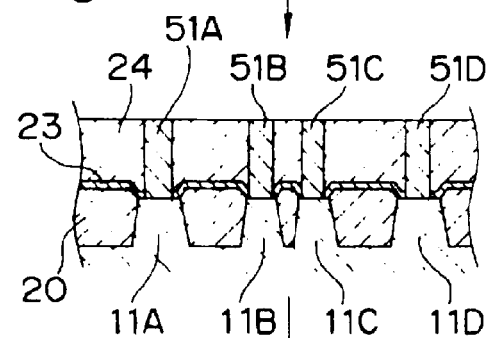
Figure 14D:
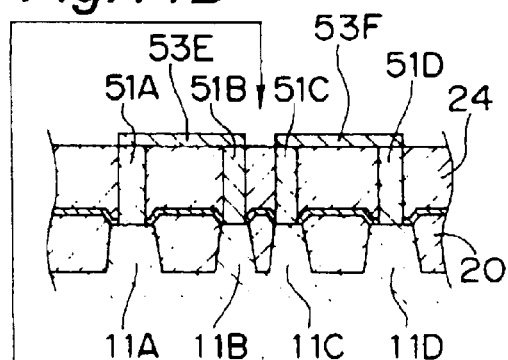

Thereafter, as shown in FIG. 14C, tungsten is buried in the interconnection trench 24a formed by the above etching, and then, the surface can be planarized so that tungsten 51A to 51D remain in only interconnection trench 24a. Further, a metal layer is deposited on the entire surface, and thereafter, etching is carried out so that a metal layer 53E connected to the tungsten 51A and 51B and a metal layer 53F connected to the tungsten 51C and 51D can be formed using node mask (not shown). The metal layers 53E and 53F thus formed constitute the cell nodes N1 and N2, respectively. The state until this process is shown in FIG. 14D.

Figure 14E:
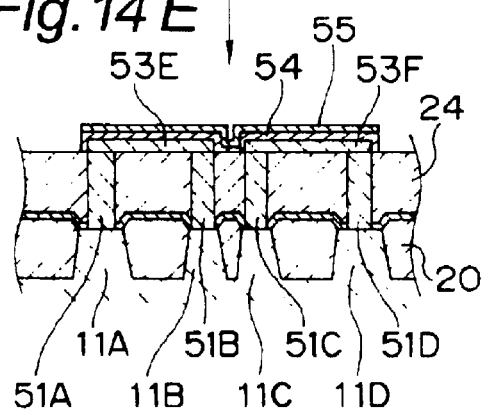

Sequentially, an insulating film 54 and a conductive film 55 are formed on the entire surface including the metal layers 53E and 53F, and thereafter, are etched so that the portion covering the metal layers 53E and 53F remains using capacitance formation mask. The state until this process is shown in FIG. 14E.

As described above, according to this fourth embodiment, the cell nodes N1 and N2 are formed of the metal layers 53E and 53F, respectively, so that the cell nodes N1 and N2 can be constituted relatively simple.

Fifth Embodiment

FIG. 15A to FIG. 15D illustrate a fifth embodiment of the present invention, that is, first to fourth modification examples of the cell node and the charge capacitance member included in the memory cell. The purpose of these modification examples is to increase the total charge capacitance determined by a cell node and a charge capacitor element composed of the cell node, insulating film and conductive film. First, in the first modification example shown in FIG. 15A, tungsten 63E and 63F constituting the cell nodes N1 and N2 are formed so as to project by only predetermined height from the upper surface of the planarization insulating film 24. Then, an insulating film 64 and a conductive film 65 constituting the charge capacitor element together with the cell nodes N1 and N2 are formed so as to fully cover the projected tungsten 63E and 63F. According to the above structure, a contact area of the tungsten 63E and 63F and the insulating film 64 becomes larger as compared with the case where tungsten is formed in flush with the planarization insulating film; as a result, the total charge capacitance can be increased.

Figure 15A:
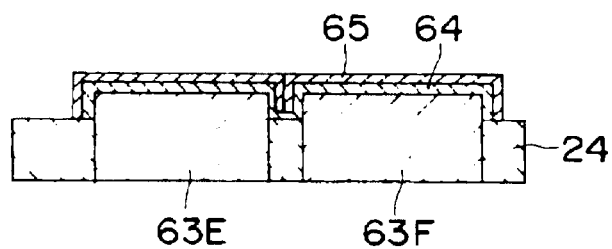
FIGS. 15A to 15D are views illustrating various modification examples of a cell node and a charge capacitor element according to a fifth embodiment of the present invention.
Figure 15B:
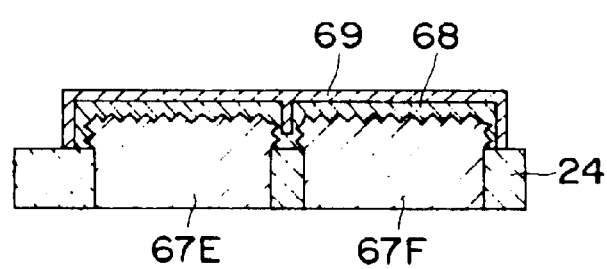

Sequentially, in the second modification example shown in FIG. 15B, first, tungsten 67E and 67F constituting the cell nodes N1 and N2 are formed so as to project by only predetermined height from the upper surface of the planarization insulating film 24, like the above first modification example. Further, the surface of the projected portion is made coarse. Then, an insulating film 68 and a conductive film 69 constituting the charge capacitor element together with the cell nodes N1 and N2 are formed so as to fully cover the projected tungsten 67E and 67F. According to the above structure, a contact area of the tungsten 67E and 67F and the insulating film 68 becomes larger as compared with the case of the first modification example shown in FIG. 1A; as a result, the total charge capacitance can be further increased.

Figure 15C:
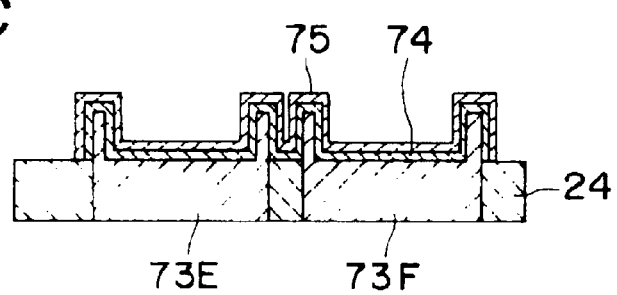

In the third modification example shown in FIG. 15C, tungsten 73E and 73F constituting the cell nodes N1 and N2 are formed so as to project by only predetermined height from the upper surface of the planarization insulating film 24 at their peripheral edge portions. Then, an insulating film 68 and a conductive film 69 constituting the charge capacitor element together with the cell nodes N1 and N2 are formed so as to fully cover the tungsten 73E and 73F inclusive of the projected peripheral edge portions. According to the above structure, a contact area of the tungsten 73E and 73F and the insulating film 74 becomes larger as compared with the case where tungsten is formed in flush with the planarization insulating film; as a result, the total charge capacitance can be increased.

Figure 15D:
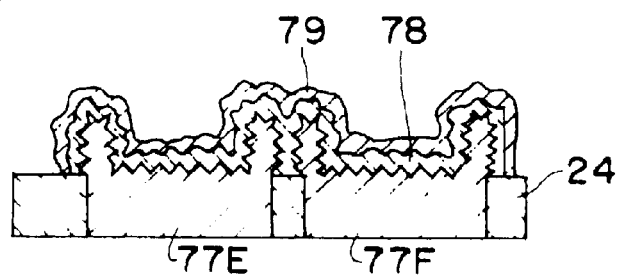

In the fourth modification example shown in FIG. 15D, first, tungsten 77E and 77F constituting the cell nodes N1 and N2 are formed so as to project by only predetermined height from the upper surface of the planarization insulating film 24 at their peripheral edge portions, like the above third modification example. Further, the surface of the projected portion is made coarse. Then, an insulating film 78 and a conductive film 79 constituting the charge capacitor element together with the cell nodes N1 and N2 are formed so as to fully cover the tungsten 77E and 77F inclusive of the projected peripheral edge portions. According to the above structure, a contact area of the tungsten 77E and 77F and the insulating film 78 becomes larger as compared with the case of the above third modification example shown in FIG. 15C; as a result, the total charge capacitance can be increased.

Sixth Embodiment

Figure 16:
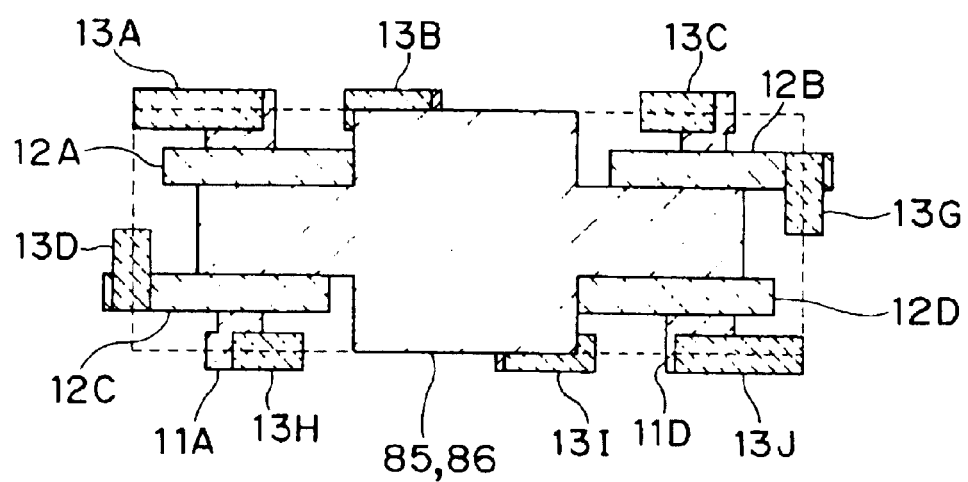
FIG. 16 is a planar layout illustrating a state of the manufacturing process of a full CMOS-type of memory cell corresponding to state shown in FIG. 2C according to a sixth embodiment of the present invention.

FIG. 16 is a planar layout illustrating a state of the manufacturing process of a full CMOS-type of memory cell corresponding to state shown in FIG. 2C according to a sixth embodiment of the present invention. In the sixth embodiment, on condition that power voltage (Vdd) is applied to a conductive film constituting a charge capacitor element as well as the above first embodiment, a conductive film can be set large comparatively and the number of lines constituting memory cell can be reduced.

In this memory cell, a charge capacitor element is constituted by forming an insulating film 85 and a conductive film 86 on cell nodes N1, N2. As shown in FIG. 16, conductive film 86 is formed so that it overlies and contacts one part of damascene lines 13B, 13I for supplying power voltage while having sufficient margin to damascene lines 13A, 13C, 13D, 13G, 13H, 13J. Therefore, conductive film 86 can be set large, and a large charge capacitance can be obtained.

Figure 17:
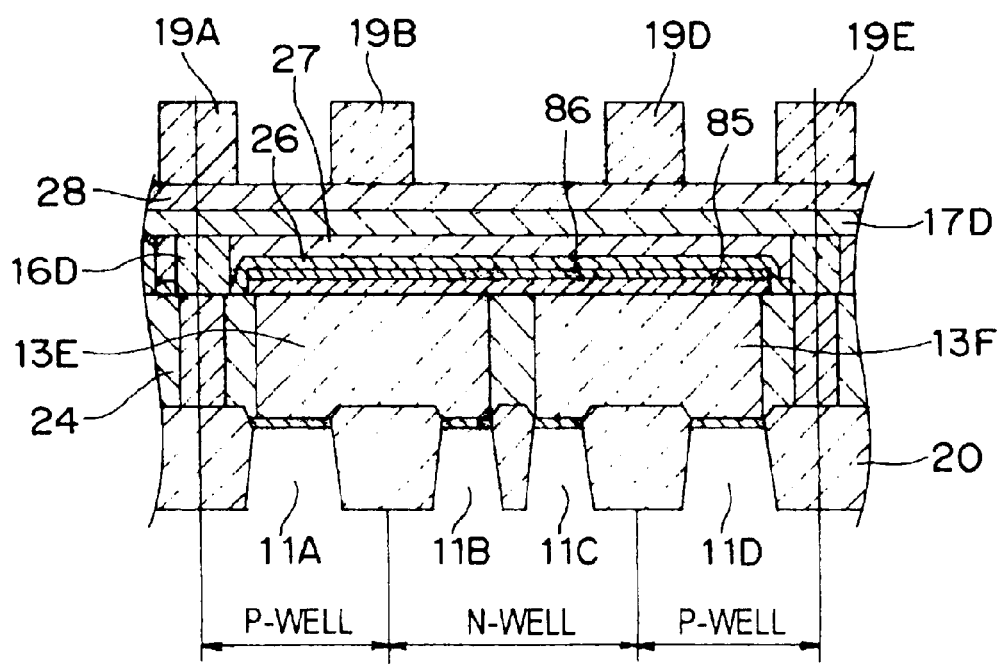
FIG. 17 is a longitudinal sectional view illustrating a state of the manufacturing process of a full CMOS-type of memory cell corresponding to state shown in FIG. 6G according to the sixth embodiment of the present invention.

Furthermore, conductive film 86 can perform as a power voltage line for supplying power voltage to damascene lines 13B and 13I since film 86 contacts with damascene lines 13B and 13I. Accordingly, in this sixth embodiment, no two-layer metal line 19C as a power voltage line (See FIG. 6G) is required on upper-layer side of memory cell. FIG. 17 illustrates a state of the manufacturing process of a full CMOS-type of memory cell corresponding to state shown in FIG. 6G according to the sixth embodiment of the present invention.

Figure 18:
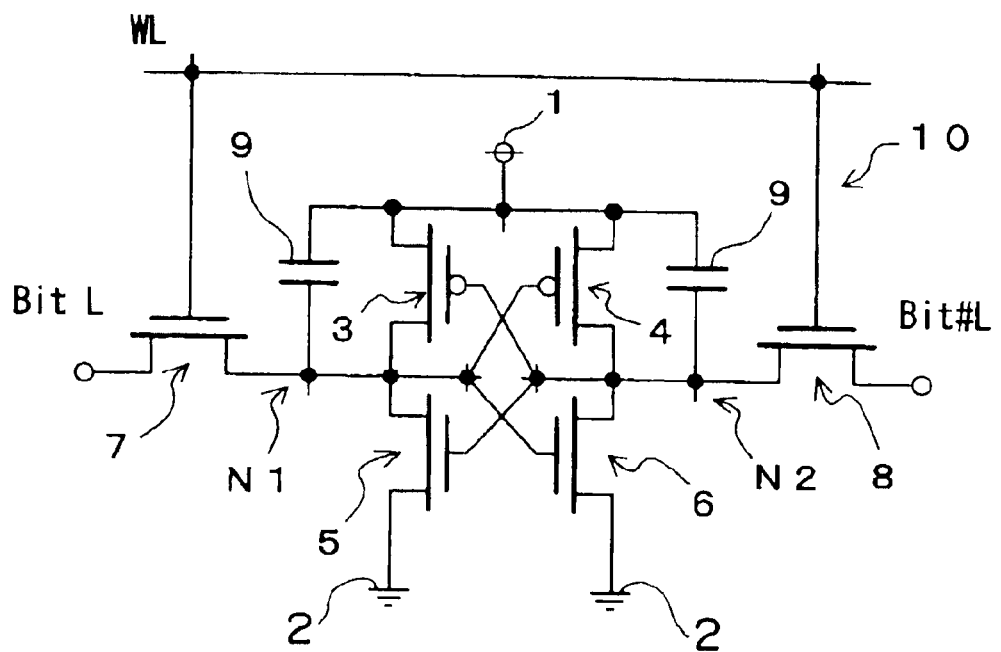
FIG. 18 is a circuit diagram of a full CMOS-type of memory cell according to the sixth embodiment of the present invention.

Thus, the number of lines constituting memory cell can be reduced and the yield of product can be improved since no two-layer metal line 19C as a power voltage line is required. Further, in this case, since regulation for width or interval of residual lines on upper-layer side, such as lines 19A, 19B, 19D, 19E is alleviated, electric characteristic of lines can be improved. FIG. 18 illustrates a circuit diagram of a CMOS-type of memory cell according to sixth embodiment of the present invention.

Seventh Embodiment

Figure 19:
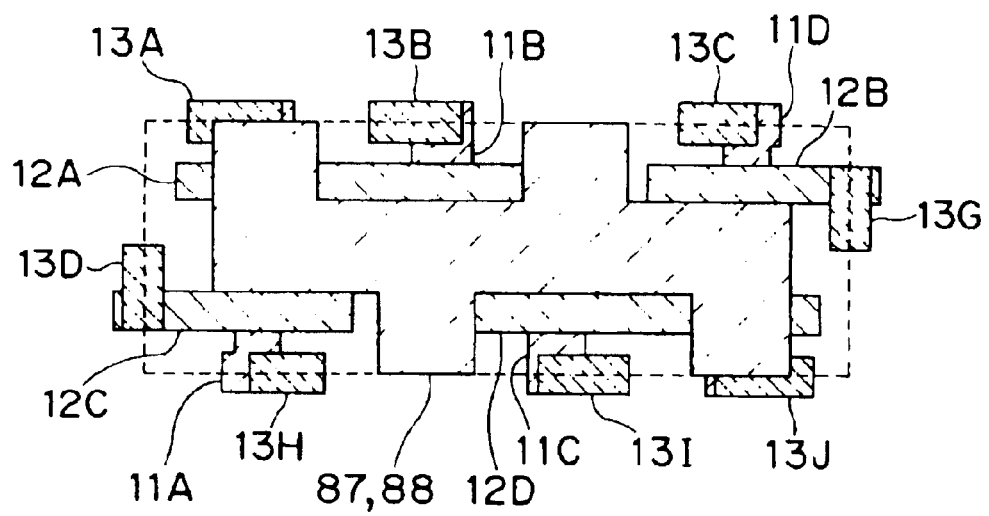
FIG. 19 is a planar layout illustrating a state of the manufacturing process of a full CMOS-type of memory cell corresponding to state shown in FIG. 2C according to a seventh embodiment of the present invention.

FIG. 19 is a planar layout illustrating a state of the manufacturing process of a full CMOS-type of memory cell corresponding to state shown in FIG. 2C according to a seventh embodiment of the present invention. In the seventh embodiment, on condition that ground voltage (Vss) is applied to a conductive film constituting a charge capacitor element as well as the above second embodiment, a conductive film can be set large comparatively and the number of lines constituting memory cell can be reduced.

In this memory cell, a charge capacitor element is constituted by forming an insulating film 87 and a conductive film 88 on cell nodes N1, N2. As shown in FIG. 19, conductive film 88 is formed so that it overlies and contacts one part of damascene lines 13A, 13J for supplying ground voltage while having sufficient margin to damascene lines 13B, 13C, 13D, 13G, 13H, 13I. It is noted that damascene lines 13A and 13J are set to a length so that lines 13A and 13J doesn't contact with lines for supplying ground voltage of the memory cell being adjacent in row direction.

Therefore, conductive film 88 can be set large, and a large charge capacitance can be obtained.

Figure 20:
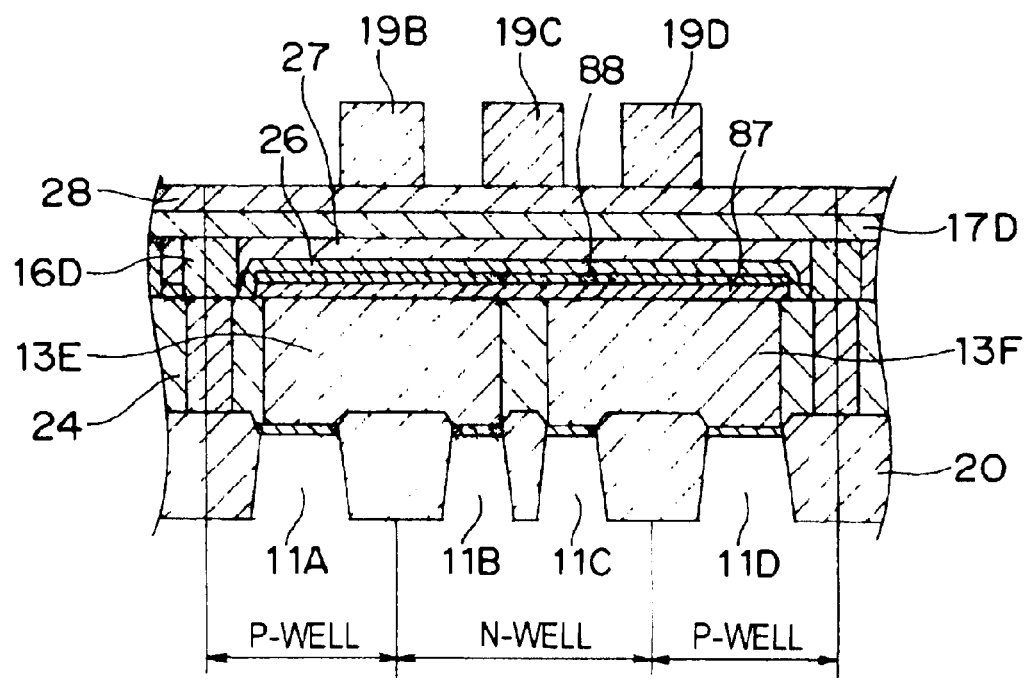
FIG. 20 is a longitudinal sectional view illustrating a state of the manufacturing process of a full CMOS-type of memory cell corresponding to state shown in FIG. 6G according to the seventh embodiment of the present invention.

Furthermore, conductive film 88 can perform as a ground voltage line for supplying ground voltage to damascene lines 13A and 13J since film 88 contacts with damascene lines 13A and 13J. Accordingly, in this seventh embodiment, no two-layer metal line 19A, 19E as a ground voltage line (See FIG. 6G) is required on upper-layer side of memory cell. FIG. 20 illustrates a state of the manufacturing process of a full CMOS-type of memory cell corresponding to state shown in FIG. 6G according to the seventh embodiment of the present invention.

Figure 21:
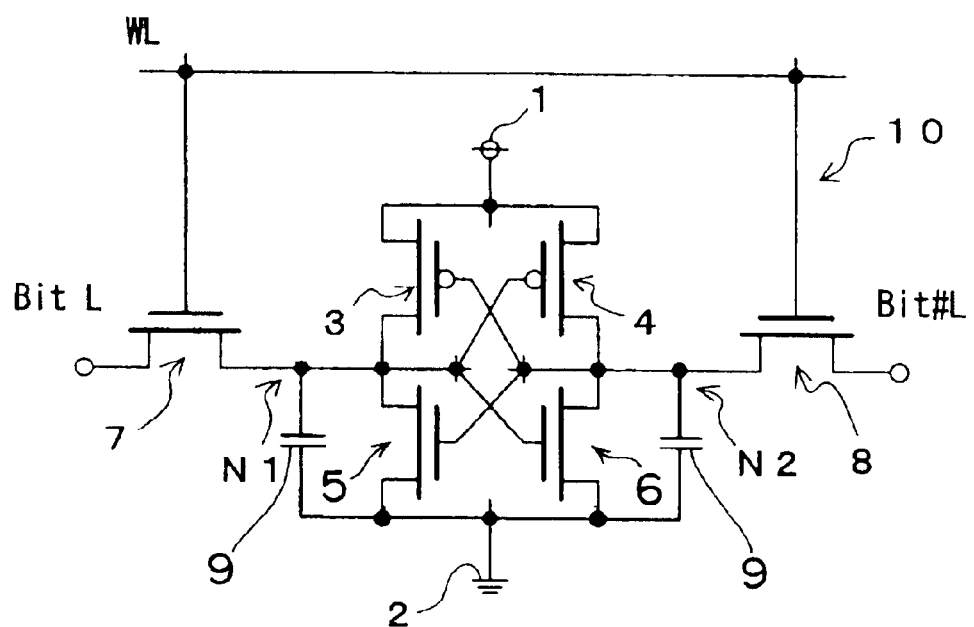
FIG. 21 is a circuit diagram of a full CMOS-type of memory cell according to the sixth embodiment of the present invention.

Thus, the number of lines constituting memory cell can be reduced and the yield of product can be improved since no two-layer metal line 19A, 19E as a ground voltage line is required. Further, in this case, since regulation for width or interval of residual lines on upper-layer side, such as lines 19B, 19C, 19D is alleviated, electric characteristic of lines can be improved. FIG. 21 illustrates a circuit diagram of a CMOS-type of memory cell according to seventh embodiment of the present invention.

Eighth Embodiment

Figure 22:
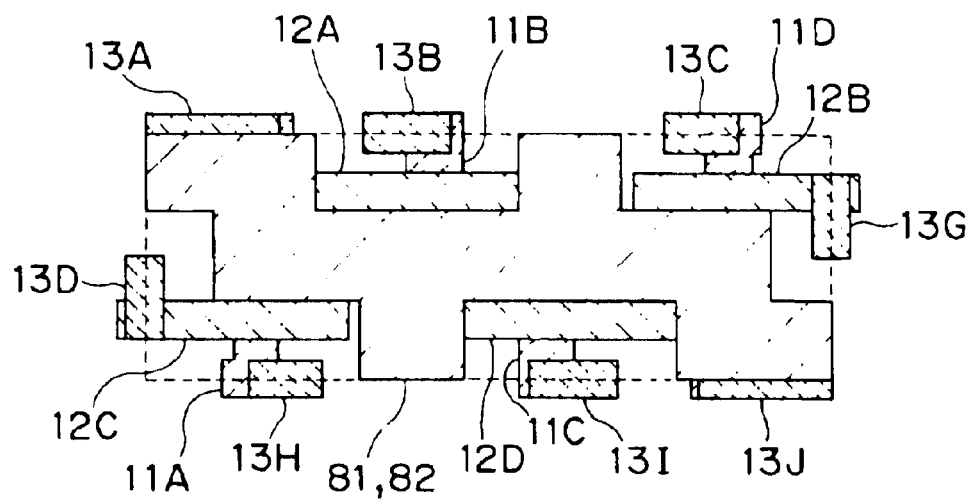
FIG. 22 is a planar layout illustrating a state of the manufacturing process of a full CMOS-type of memory cell corresponding to state shown in FIG. 2C according to a eighth embodiment of the present invention.

FIG. 22 is a planar layout illustrating a state of the manufacturing process of a full CMOS-type of memory cell corresponding to state shown in FIG. 2C according to an eighth embodiment of the present invention. In the eighth embodiment, a modification of a full CMOS-type of memory cell according the above seventh embodiment is proposed for allowing each memory cell to commonly share a conductive film and damascene lines for supplying ground voltage with adjacent memory cell. More particularly, as shown in FIG. 22, a capacitor element is constituted by forming an insulating film 81 and a conductive film 82, and a conductive film 82 and damascene lines 13A, 13b for supplying ground voltage are formed extending in row direction while contacting with each other.

Figure 23:
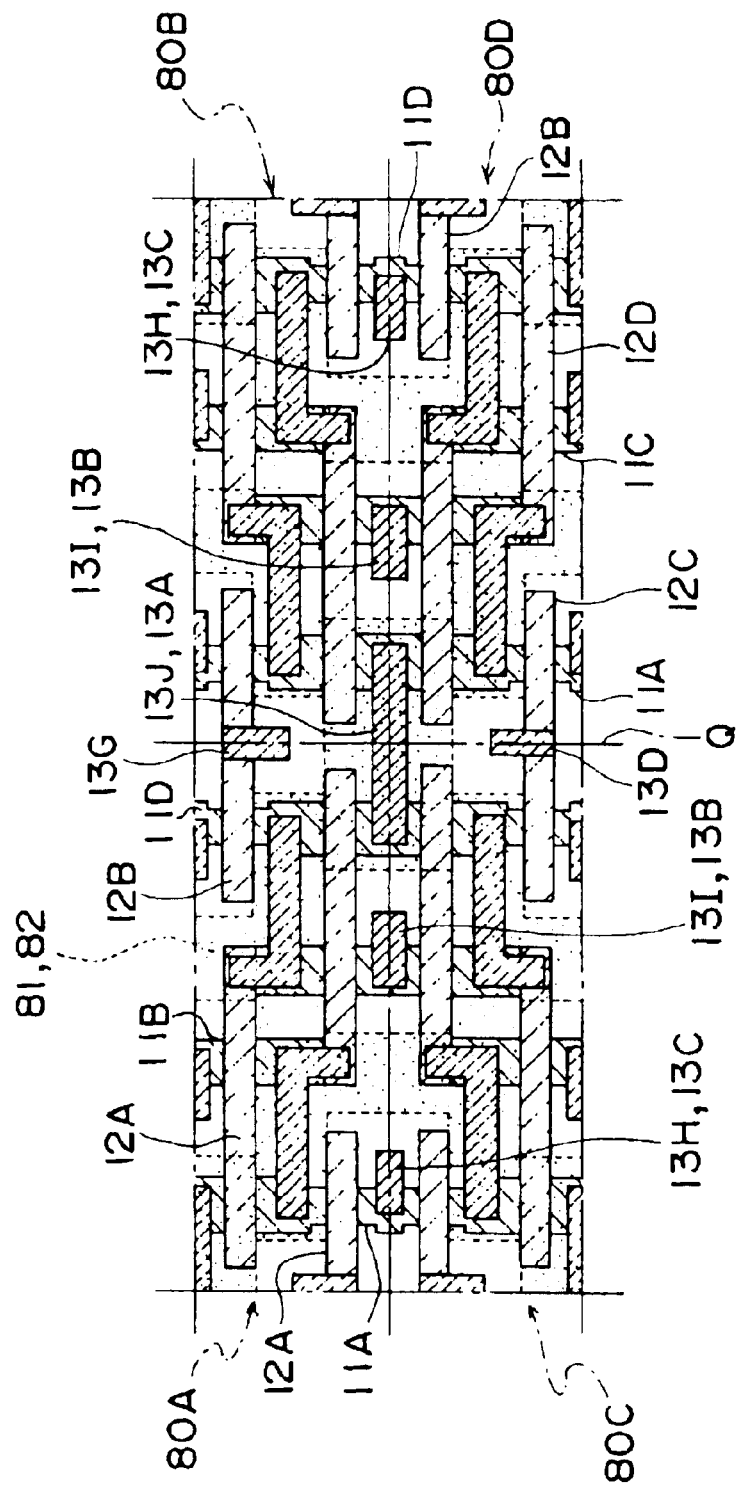
FIG. 23 is a planar layout illustrating a structure in which an insulating film and a conductive film are shared in four adjacent CMOS-type of memory cells.

FIG. 23 shows an insulating film 81 and a conductive film 82 commonly shared by four adjacent full CMOS-type of memory cells 80A, 80B, 80C, 80D. Memory cells 80A and 80D on upper left side and lower right side in FIG. 23 are configured with same arrangement of components as a memory cell shown in FIG. 22. Memory cells 80B and 80C on lower left side and upper right side in FIG. 23 are configured with axisymmetrical arrangement of components to memory cells 80A and 80D, respectively, via a center line Q. Each of insulating film 81 and conductive film 82 constituting a charge capacitor element is integrally formed over four memory cells 80A, 80B, 80C, 80D.

A damascene line 13G for second bit line Bit # L is commonly shared and an insulating film 81, a conductive film 82 and a damascene line 13J for supplying ground voltage are commonly shared between memory cell 80A and 80B adjacent in row direction, each being in axisymmetrical to each other. Likewise, a damascene line 13D for first bit line Bit L is commonly shared and an insulating film 81, a conductive film 82 and a damascene line 13A for supplying ground voltage are commonly shared between memory cell 80C and 80D adjacent in row direction, each being in axisymmetrical to each other.

In this case, damascene lines 13H, 13C for first or second bit line, damascene lines 13I, 13B for supplying power voltage, damascene lines 13J, 13A for supplying ground voltage, an insulating film 81 and a conductive film 82 are commonly shared between memory cells 80A and 80C adjacent in column direction. Likewise, damascene lines 13H, 13C for first or second bit line, damascene lines 13I, 13B for supplying power voltage, damascene lines 13J, 13A for supplying ground voltage, an insulating film 81 and a conductive film 82 are commonly shared between memory cells 80B and 80D adjacent in column direction.

Thus, in this eighth embodiment, since a conductive film 82 and damascene lines 13A, 13B are integrally formed to be shared between adjacent memory cells, a large charge capacitance can be obtained, and in addition, a ground connection of memory cell can be reinforced.

Of course, the present invention is not limited to the above embodiments, and various modifications and changes in design are possible within the range without departing from the scope of the invention.

What is claimed is:

1. A semiconductor memory with a plurality of full CMOS-type of memory cells arranged in an array, each memory cell comprising:

a first load transistor and a first driver transistor connected in series between a power supply voltage line and a ground voltage line, and having a gate connected to a same line in common;

a second load transistor and a second driver transistor connected in series between the power supply voltage line and the ground voltage line, and having a gate connected to a same line in common;

a first cell node which connects an active region of said first load transistor to an active region of said first driver transistor, and connects with each gate of said second load transistor and said second driver transistor;

a second cell node which connects an active region of said second load transistor to an active region of said second driver transistor, and connects with each gate of said first load transistor and said first driver transistor;

a first access transistor connected between said first cell node and a first bit line, and having a gate connected to a word line;

a second access transistor connected between said second cell node and a second bit line in conjugate with said first bit line, and having a gate connected to a the word line;

an insulating film and a conductive film directly formed on said first and second cell nodes for constituting a charge capacitor element with said first and second cell nodes, so that said insulating film is held between the first and second cell nodes and the conductive film, covering both said first and second cell nodes in common.

2. The semiconductor memory according to claim 1, wherein, in each memory cell, each of said first and second driver transistors is constituted on either one of a first conductive-type well regions formed at both sides on a semiconductor substrate, and said first and second load transistors are constituted on a second conductive-type well region formed at the center on said semiconductor substrate, and said first cell node is arranged to cross said first conductive-type well region on which said first driver transistor is constituted and said second conductive-type well region on which said first load transistor is constituted, and said second cell node is arranged to cross said first conductive-type well region on which said second driver transistor is constituted and said second conductive-type well region on which said second load transistor is constituted.

3. The semiconductor memory according to claim 1, wherein said first and second cell nodes are elements formed by burying a conductive material in a trench formed in an interlayer insulating film deposited on each of transistors.

4. The semiconductor memory according to claim 1, wherein a margin between said conductive film and each contact line which connects with said active region of each load transistor for supplying power voltage is set less than a margin between said conductive film and each contact line which connects with each bit line or connects with said active region of each driver transistor for supplying ground voltage on condition that the power voltage is applied to said conductive film constituting said charge capacitor element.

5. The semiconductor memory according to claim 1, wherein said conductive film is formed to connect with each contact line which connects with said active region of each load transistor for supplying power voltage, and performs as said power voltage line on condition that the power voltage is applied to said conductive film constituting said charge capacitor element.

6. The semiconductor memory according to claim 1, wherein a margin between said conductive film and each contact line which connects with said active region of each driver transistors for supplying ground voltage is set less than a margin between said conductive film and each contact line which connects with each bit line or connects with said active region of each load transistor for supplying power voltage on condition that the ground voltage is applied to said conductive film constituting said charge capacitor element.

7. The semiconductor memory according to claim 1, wherein said conductive film is formed to connect with each contact line which connects with said active regions of each driver transistor for supplying ground voltage, and performs as said ground voltage line on condition that the ground voltage is applied to said conductive film constituting said charge capacitor element.

8. The semiconductor memory according to claim 7, wherein said conductive film and said contact line for supplying ground voltage are formed in common between adjacent memory cells.

9. The semiconductor memory according to claim 1, wherein a surface of said first and/or second cell node is formed so as to project from the circumference suface on at least one portion.

10. The semiconductor memory according to claim 1, wherein a surface of said first and/or second cell node is made coarse.

* * * * *